(12) United States Patent
Aoki et al.

(10) Patent No.: US 7,309,950 B1
(45) Date of Patent: Dec. 18, 2007

(54) PIEZOELECTRIC DEVICE, LIQUID DISCHARGE HEAD EMPLOYING THIS DEVICE AND LIQUID DISCHARGE APPARATUS

(75) Inventors: Katsumi Aoki, Yokohama (JP); Kenichi Takeda, Yokohama (JP); Toshihiro Ifuku, Yokohama (JP); Takanori Matsuda, Tokyo (JP); Hiroshi Funakubo, Yokohama (JP); Shintaro Yokoyama, Yokohama (JP); Satoshi Okamoto, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 0 days.

(21) Appl. No.: 11/564,643

(22) Filed: Nov. 29, 2006

Related U.S. Application Data

(63) Continuation of application No. PCT/JP2006/316802, filed on Aug. 22, 2006.

(30) Foreign Application Priority Data

Aug. 23, 2005 (JP) ............................. 2005-241429

(51) Int. Cl.
*H01L 41/08* (2006.01)
(52) U.S. Cl. ...................... 310/358; 310/331
(58) Field of Classification Search ................ 310/358, 310/359, 328, 330–332
See application file for complete search history.

(56) References Cited

U.S. PATENT DOCUMENTS

| | | | |
|---|---|---|---|
| 5,320,910 A | 6/1994 | Banno et al. | |
| 7,059,711 B2 | 6/2006 | Aoto et al. | |
| 7,069,631 B2 | 7/2006 | Unno et al. | |
| 7,215,067 B2 | 5/2007 | Ifuku et al. | |
| 2003/0178914 A1 | 9/2003 | Ogawa et al. | |
| 2006/0176342 A1 | 8/2006 | Aoto et al. | |

FOREIGN PATENT DOCUMENTS

| | | |
|---|---|---|
| CN | 1447455 A | 10/2003 |
| EP | 1 349 220 A | 10/2003 |
| JP | 3256254 B | 11/2001 |
| JP | 2003-282986 A | 10/2003 |
| JP | 2004-111850 A | 4/2004 |

OTHER PUBLICATIONS

Smits et al., "The Constituent Equations of Piezoelectric Heterogeneous Bimorphs," IEEE Transactions on Ultrasonics, Ferroelectrics, and Frequency Control, vol. 38, No. 3, May 1991.

Cao, "Full Set Material Properties of Multi-Domain and Single-domain $(1-x)Pb(Mg_{1/3}Nb_{2/3})O_3-xPbTiO_3$ and $(1-x)Pb(Zn_{1/3}Nb_{2/3})O_3-xPbTiO_3$ Single Crystals and the Principle of Domain Engineering Method" in *Piezoelectric Single Crystals and Their Application*, pp. 236-256, no date available.

K. Okazaki, Ceramic Dielectrics Engineering, Gakuken Co., Ltd., Jun. 1, 1992, pp. 334 & 335 (and partial English-language translation thereof).

*Primary Examiner*—Mark Budd
(74) *Attorney, Agent, or Firm*—Fitzpatrick, Cella, Harper & Scinto

(57) ABSTRACT

A piezoelectric device includes a piezoelectric member and a pair of electrodes, and for piezoelectric constants $d_{33}$ and $d_{31}$ of the piezoelectric member, the following relational expression (I) is established:

$$0.1 \leq |d_{33}/d_{31}| \leq 1.8. \qquad (I)$$

8 Claims, 12 Drawing Sheets

FIG. 2
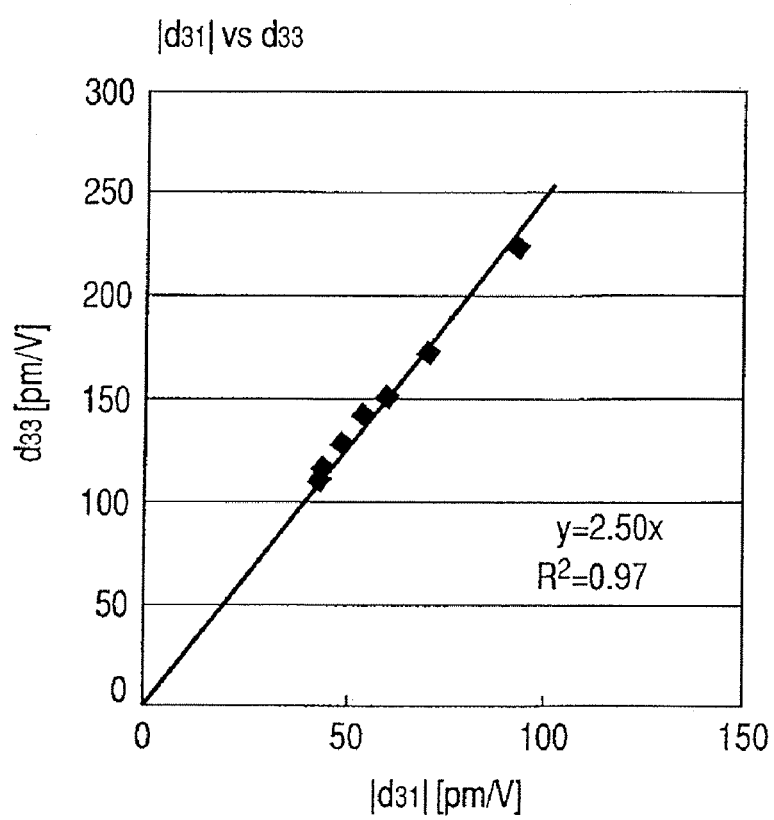
FIG. 3A
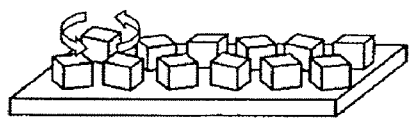
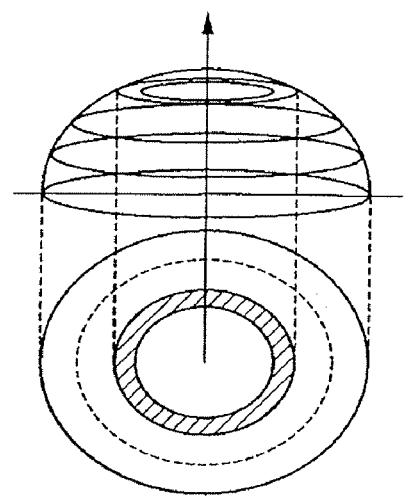
FIG. 3B
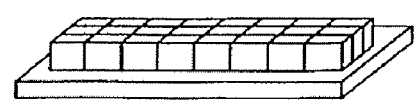
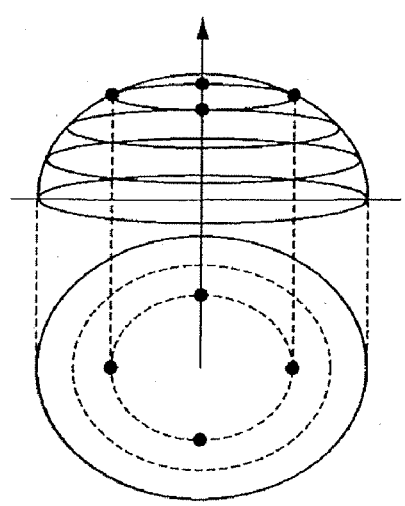

PIEZOELECTRIC DEVICE, LIQUID DISCHARGE HEAD EMPLOYING THIS DEVICE AND LIQUID DISCHARGE APPARATUS

This application is a continuation of International Application No. PCT/JP2006/316802 filed on Aug. 22, 2006, which claims the benefit of Japanese Patent Application No. 2005-241429 filed on Aug. 23, 2005.

BACKGROUND OF THE INVENTION

1. Field of the Invention

The present invention relates to a piezoelectric device, a liquid discharge head that employs this device and a liquid discharge apparatus.

2. Description of the Related Art

A piezoelectric device is a functional device that utilizes a piezoelectric phenomenon, i.e., a piezoelectric effect whereby an electric field is generated upon the application of a stress to a piezoelectric material, or a converse piezoelectric effect whereby a stress is produced by applying an electric field to a piezoelectric material.

A device that utilizes the piezoelectric effect is employed, for example, as a piezo spark ignition device, an acceleration sensor device, a gyro angular velocity sensor device or a strain gauge device. A device that utilizes the converse piezoelectric effect is employed, for example, as an ultrasonic vibration device, or a precision drive device for a loudspeaker or an SPM (Scanning Probe Microscope) stage. Further, recently, a device utilizing the converse piezoelectric effect has been employed, for example, as a discharge drive device for an ink jet head and as a drive device for an MEMS.

Piezoelectric devices that include a function for employing the converse piezoelectric effect to perform fine, precision driving can be roughly classified as belonging to two categories, in accordance with a direction, relative to the direction in which an electric field is applied, in which strain and stress, generated by a piezoelectric device, due to the converse piezoelectric effect are to be obtained.

The first category is a $d_{33}$ mode type or a vertical vibration type that employs a strain/stress (horizontal effects) in the direction (the direction $d_{33}$) parallel to the direction to which an electric field is applied. The other category is a $d_{31}$ mode type or a transverse vibration type that employs strain/stress (vertical effects) in a direction (the direction $d_{31}$) corresponding to the vertical plane in the direction in which an electric field is applied. Further, in a case wherein strain/stress in a shearing direction (the direction $d_{15}$) is employed relative to the direction in which electric field is applied, a piezoelectric device can be categorized as being a transverse vibration mode type or a vertical vibration mode type, mainly in accordance with the direction in which strain is obtained.

When with the vertical vibration mode, especially, strain/stress in the direction $d_{33}$, is employed for a piezoelectric actuator, a displacement that is caused by stress/strain parallel to the input electric direction of a piezoelectric material is employed relative to the direction in which the electric field is input. Because of the property of the piezoelectric material, the amount of displacement at this time is only about 1%, at most, of the thickness of the piezoelectric material to which the input electric field is applied. Therefore, in order to obtain a large displacement, the piezoelectric material to which an electric field is to be applied should be thick. However, when the thickness is increased, an electric field must be applied at an intensity consonant with the thickness in order to obtain a displacement that matches the performance of the piezoelectric material, and therefore, the drive voltage must be raised. Thus, in order to resolve this problem, a configuration has been proposed whereby, in order to prevent an increase in the drive voltage, electrodes are laminated so that a drive electric field is applied to a piezoelectric member in a direction perpendicular to a displacement extraction direction.

When in the transverse vibration mode, especially, strain/stress in the direction $d_{31}$, is employed for a piezoelectric actuator, the stress/strain exerted on the plane perpendicular to the direction of the input electric field for a piezoelectric member is employed relative to the input electric field direction. At this time, generally, the displacement of the piezoelectric member is much smaller than in the vertical vibration mode. However, in the mode $d_{31}$, when the piezoelectric device is bound to the substrate, the substrate is bent as the piezoelectric member is distorted during the transverse vibration mode, and as a result, a greater displacement can be obtained, even though the thickness, in the direction in which the electric field is applied, is small. Additionally, since the thickness in which the electric field is applied is small, a low drive voltage can be set, so that a piezoelectric actuator of a bending mode type is generally employed.

The types described above are appropriately selected in accordance with the use of a piezoelectric actuator.

However, for a precision drive source for an MEMS that includes a fine structure, or a high-density multi-nozzle ink jet head that is applied for an ink jet apparatus for which high speed and high image quality are required, a piezoelectric actuator having the following configuration is effective. This piezoelectric actuator, of a bending mode type, employs the transverse vibration mode $d_{31}$ employed by a piezoelectric member. Through precise processing, the piezoelectric member can be deposited directly on a substrate that includes drive power supply electrodes, using a thin film deposition technology.

However, since the piezoelectric member deposited by the thin film deposition technology is deposited in a state bounded to the substrate that includes the drive power supply electrodes, the piezoelectric property is not satisfactory, when compared with that of a piezoelectric member made of bulk ceramics.

As a relation between piezoelectric constants $d_{33}$ and $d_{31}$, for example, for bulk ceramics, individual components $d_{33}$ and $d_{31}$ of PZT (Pb (Zr, Ti)O$_3$), for which a Zr/Ti ratio is allocated, are described in Ceramic Dielectrics Engineering, page 334 (Kiyoshi Okazaki, Gakuken Co., Ltd.) (Non-patent Document 1). A graph obtained by plotting the values of the constants $d_{33}$ and $d_{31}$ is shown in FIG. 2. The line running from the origin of the graph in FIG. 2 is a line obtained by linear approximation based on plotted data, and inclination $d_{33}/|d_{31}|=2.5$ is represented.

In Japanese Patent No. 3256254, a piezoelectric material is proposed as a material appropriate for an underwater transducer (hydrophone) that utilizes inverse piezoelectric effects and piezoelectric effects. This material is a composite material, composed of organic and inorganic materials, such that by defining the piezoelectric constant $d_{31}$ as substantially zero, a large piezoelectric constant dh under a hydrostatic pressure, dh=$d_{33}$+2×$d_{31}$, can be obtained.

The piezoelectric constant $d_{31}$ can be determined by using a unimolph cantilever method. A relation of the amount of displacement of a unimolph cantilever relative to an input voltage V is written in J. G. Smith and W. Choi, "The Constituent Equations of Piezoelectric Heterogeneous Bimorph", IEEE trans. Ultrason. Ferro. Freq. Control 38 (1991) 256-270. (Non-patent Document 2). The material property values of the relations are written in W. Cao, "Full Set Material Properties of Multi-Domain and Single-domain (1-x)Pb(Mg1/3Nb2/3)O3-xPbTiO3 and (1-x)Pb(Zn1/3Nb2/3)O3-xPbTiO3 Single Crystals and the Principle of Domain Engineering Method", Piezoelectric Single Crystals and Their Application (pp. 236-256), edited by S. Trolier-Mckinstry, L. E. Cross and Y. Yamashita (Non-patent Document 3).

SUMMARY OF THE INVENTION

One objective of the present invention is to provide a piezoelectric member that is appropriate for a piezoelectric actuator that is superior in the displacement performance, efficiency and usage durability described above, especially to provide a piezoelectric member that can be appropriately employed for a piezoelectric actuator of a transverse vibration mode that is suitable for fine structure processing.

In order to achieve the above objective, the present inventors compounded and deposited various types of piezoelectric materials, and finally obtained the following invention.

The above objective is achieved by a piezoelectric device comprising: a piezoelectric member; and a pair of electrodes contacting the piezoelectric member, wherein, for piezoelectric constants $d_{33}$ and $d_{31}$ of the piezoelectric member, relation (I)

$$0.1 \leq |d_{33}/d_{31}| \leq 1.8 \tag{I}$$

is satisfied.

Further, according to the present invention, a liquid crystal discharge head comprises the above described piezoelectric device, and a liquid discharge apparatus comprises this liquid discharge head.

According to this invention, since the piezoelectric device is superior in displacement performance, and the displacement in the direction $d_{33}$ is small, the actuator displacement can be efficiently employed. Further, according to the invention, a piezoelectric member superior in usage durability, especially a piezoelectric member that can be appropriately employed as a piezoelectric actuator for a transverse vibration mode that is suitable for precise machining processing, can be provided.

Further features of the present invention will become apparent from the following description of exemplary embodiments with reference to the attached drawings.

BRIEF DESCRIPTION OF THE DRAWINGS

FIGS. 1A-2 is a top view of the unimolph cantilever in FIGS. 1A-1.

FIGS. 1B-1 is a side view of a unimolph actuator, the basic structure of a piezoelectric actuator that employs the transverse vibration mode of a piezoelectric member.

FIGS. 1B-2 is a top view of the unimolph actuator in FIG. 1B-1.

FIG. 2 is a graph showing piezoelectric constants $d_{33}$ and $d_{31}$ for the individual components of PZT in non-patent document 1.

FIG. 3A is a diagram showing a pattern when, for a uniaxial crystal having a <100> PZT perovskite type structure, the pole measurement of a {110} asymmetrical plane is performed using X-ray diffraction.

FIG. 3B is a diagram showing a pattern when, for a <100> single crystal having a PZT perovskite type structure, the pole measurement of a {110} asymmetrical plane is performed using X-ray diffraction.

FIGS. 10-1, 10-2, 10-3, 10-4, 10-5, 10-6 and 10-7 are cross-sectional views of the structure for explaining the manufacturing process for an ink jet head according to the mode.

FIGS. 13-1 is a side view of a layer structure after a d31 measurement sample has been cut.

FIGS. 13-2 is a top view of the shape of the $d_{31}$ measurement sample.

FIGS. 15-1 is a schematic diagram showing an apparatus for measuring a displacement of a unimolph cantilever in order to explain $d_{31}$ measurement.

FIGS. 15-2 is a schematic diagram showing the layer structure of a basic sample in order to explain the $d_{31}$ measurement.

DESCRIPTION OF THE EMBODIMENTS

[Piezoelectric Device]

While referring to FIGS. 1A-1, 1A-2, 1B-1 and 1B-2, an explanation will be given for the structure of a piezoelectric device that employs a transverse vibration mode according to one mode of the present invention.

The piezoelectric device of this mode comprises: a piezoelectric member and a pair of electrodes contacting the piezoelectric member. In the functional view, the piezoelectric device includes at least a strain/stress generator, which is constituted by two electrodes (an upper electrode and a lower electrode), for supplying a drive voltage, and a piezoelectric member sandwiched between them. The piezoelectric device may also include a vibration plate section constituted by a vibration plate provided on one of the electrodes (a lower electrode in this specification, for convenience sake).

Figures 1, 1A:
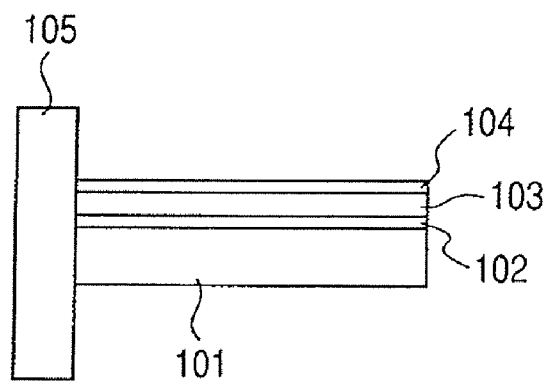
FIGS. 1A-1 is a side view of a unimolph cantilever, the basic structure of a piezoelectric actuator that employs the transverse vibration mode of a piezoelectric member.
Figures 1, 1B:
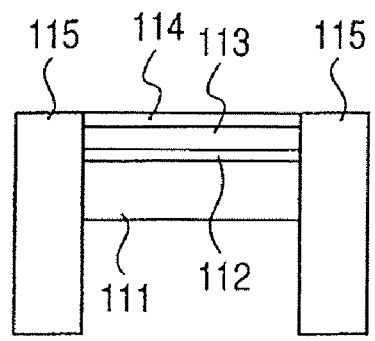
Figures 1, 1A, 2:
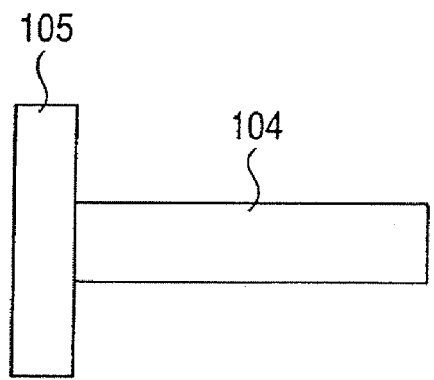
Figures 1, 1B, 2:
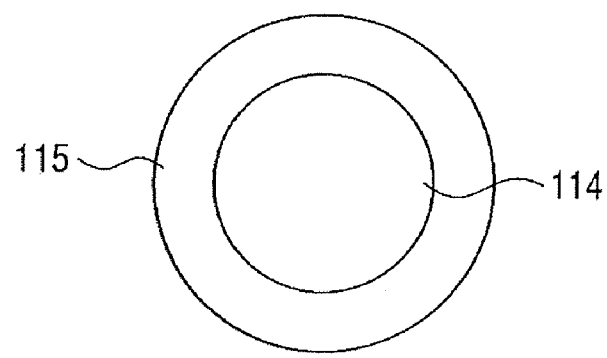

FIGS. 1A-1 and 1A-2 are a side view and a top view of the basic structure of a unimolph cantilever, an example piezoelectric actuator that employs the transverse vibration mode of a piezoelectric member. The basic structure comprises: a vibration plate 101, a lower electrode 102, a piezoelectric member 103, an upper electrode 104 and a cantilever fixing portion 105. When a voltage is applied to the upper and lower electrodes 102 and 104, the piezoelectric member 103 is extended or contracted in the plane direction while the open end of the cantilever vibrates vertically (upwardly and downwardly). This piezoelectric device (unimolph cantilever) is used, for example, to mirror the driving of an optical scanner.

FIGS. 1B-1 and 1B-2 are a side view and a top view of the basic structure of a unimolph actuator, an example piezoelectric actuator that employs the transverse vibration mode of a piezoelectric member. The basic structure comprises: a vibration plate 111, a lower electrode 112, a piezoelectric member 113, an upper electrode 114 and an actuator holding base 115. When a voltage is applied to the upper and lower electrodes 112 and 114, the piezoelectric member 113 is extended or contracted in the plane direction, and the vibration plate 111 vibrates vertically while the center portion of the actuator is displaced, to the maximum. This piezoelectric device is used, for example, for an ink jet head.

An explanation will now be given for the components of the piezoelectric device for this mode, the terms written in this specification, an ink jet head for which the piezoelectric device of this mode can be applied and an ink jet printer that employs this ink jet head.

[Piezoelectric Member]

Piezoelectric constants $d_{33}$ and $d_{31}$ of a piezoelectric member used for this mode satisfy the following relation (I):

$$0.1 \leq |d_{33}/d_{31}| \leq 1.8 \quad (I).$$

Strain or stress is generated upon the application of an electric field to the piezoelectric member, and piezoelectric constants represent the distortion capability relative to the electric field. Generally, when the converse piezoelectric effect is the matter under discussion, as in this mode, [pm/V] is employed as a unit, while when the piezoelectric effect is the matter under discussion, [pC/N] is employed as a unit.

When three orthogonal axes 1, 2 and 3 are defined, the first numeral in the subscripts for $d_{33}$ and $d_{31}$ indicates the direction in which an electric field is applied, and the second numeral indicates the direction of strain.

Generally, for experiential purposes applicable to various piezoelectric materials, the assumed range for $|d_{33}/d_{31}|$ is $2<|d_{33}/d_{31}|<3$.

Further, for a piezoelectric material used for an underwater transducer for which strain in the $d_{31}$ direction becomes noise, the use for $d_{31}$ of a value that was substantially 0 has been attempted. That is, the development of an organic/inorganic composite piezoelectric material that obtains $|d_{33}/d_{31}| \geq 3$ has been attempted. However, when an organic/inorganic composite piezoelectric material was selected, the absolute value of the effective piezoelectric constant $d_{33}$ for the underwater transducer was lowered.

In order to achieve the above described objective of the invention, the present inventors selected a pulse MOCVD method as a composite piezoelectric member deposition means, and through discussion of the composite deposition method, found that the values for a thus obtained piezoelectric member fell outside the range indicated for the experiential relative relationship of $d_{33}$ and $d_{31}$. Further, the present inventors found that such a piezoelectric member was appropriate for use as a piezoelectric actuator that employed a transverse vibration mode.

Specifically, when $$0.1 \leq |d_{33}/d_{31}| \leq 1.8 \quad (I)$$

is established, the piezoelectric member is appropriate for use as a piezoelectric actuator that employs a transverse vibration mode.

When the relationship of the piezoelectric constants $d_{33}$ and $d_{31}$ is within the range $|d_{33}/d_{31}| \leq 1.8$, the displacement in the transverse vibration mode is large, and the displacement in the vertical vibration mode is suppressed, so that the displacement of the actuator can be efficiently utilized. Furthermore, a piezoelectric device can be provided for which there is less deterioration of the properties when used for an extended period of time.

While it is not readily apparent why the piezoelectric device of this mode can obtain the above described effects, the present inventors believe that the reason is as follows. During a process for the deposition of a piezoelectric member on a film deposition substrate, first, cores of a piezoelectric material that serve as film deposition starting points are formed, interspersed on the film deposition substrate. Then, the piezoelectric material begins to grow from the cores on the surface in the surface direction and in the thickness direction of the film deposition substrate to form the piezoelectric film. At this time, piezoelectric material portions, as they grow from the adjacent cores, meet with each other in the surface direction to form a film. The present inventors believe that during this process the coupling state greatly affects the relative relationship $|d_{33}/d_{31}|$ of the piezoelectric constants. Further, to form the piezoelectric member of this mode, a pulse MOCVD is selected as the film deposition method, and the pulse time interval is accurately adjusted, so that the coupled state of the piezoelectric material that is grown from the adjacent cores during the film deposition process can be controlled. As a result, the present inventors believe that the piezoelectric member for this mode can be obtained.

Additionally, $|d_{33}/d_{31}|<0.1$ is established as the relationship for the piezoelectric constants $d_{33}$ and $d_{31}$ only in an area that is provided when the absolute values of $d_{33}$ and $d_{31}$ are small, and this relationship is especially not appropriate for a piezoelectric member of a piezoelectric actuator that employs a transverse vibration mode. A preferable range for the relationship of the piezoelectric constants $d_{33}$ and $d_{31}$ is $0.14 \leq |d_{33}/d_{31}| \leq 1.5$.

The piezoelectric member for this mode can be obtained by adjusting, for each material, the pulse time interval employed for the film deposition method, specifically, for the pulse MOCVD method.

For this mode, PZT and relaxor piezoelectric materials are especially preferable. These are materials for which the above described coupled state can be easily controlled.

It is preferable that the film thickness of the piezoelectric member be equal to or greater than 1 μm and equal to or smaller than 10 μm, because when the piezoelectric member is employed for a piezoelectric actuator using a transverse vibration mode, an appropriate effective electric field for driving the piezoelectric actuator can be set without the use of a special drive power source being required.

[PZT/Relaxor Piezoelectric Member Material]

The PZT material in the specification is $Pb(Zr_x, Ti_{1-x})O_3$ [$0<x<1$], as indicated by a general formula, and Pb or an element for replacing Zr or Ti may be added to the main element, as needed. The element to be added can be La, Ca, Nd, Nb, Ta, Sb, Bi, Si, Cr, Fe, Sc, Sr or Pb. Since the compliance for a PZT material is smaller than for a relaxor material, it is preferable that a range of $150 \leq |d_{33}| \leq 300$ be designated. Further, $150 \leq |d_{31}|$ is more preferable when the piezoelectric member is employed for a piezoelectric actuator using a transverse vibration mode.

Relaxor piezoelectric materials in this specification are a ferroelectric material group, for which the temperature dependency of the permittivity generally has a broad shape. The relaxor piezoelectric materials are, for example, $(Pb(Mn, Nb)O_3)_{1-x}$—$(PbTiO_3)_x$(PMN-PT) $[0 \leq x < 1]$, $(Pb(Zn, Nb)O_3)_{1-x}$-$(PbTiO_3)_x$(PZN-PT) $[0 \leq x < 1]$, $(Pb(Ni, Nb)O_3)_{1-x}$- $(PbTiO_3)_x$(PNN-PT) $[0 \leq x < 1]$, $(Pb(In, Nb)O_3)_{1-x}$—$(PbTiO_3)_x$(PIN-PT) $[0 \leq x < 1]$, $(Pb(Sc, Nb)O_3)_{1-x}$—$(PbTiO_3)_x$(PSN-PT) $[0 \leq x < 1]$ and $(Pb(Yb, Nb)O_3)_{1-x}$—$(PbTiO_3)_x$(PYN-PT) $[0 \leq x < 1]$. The range $|d_{33}| \leq 150$ is preferable since the compliance of the relaxor material is large. Further, $150 \leq |d_{31}|$ is more preferable when the piezoelectric member is employed for a piezoelectric actuator using a transverse vibration mode.

The PZT and the relaxor piezoelectric materials have been explained by employing specific examples. However, the PZT and the relaxor piezoelectric members according to the mode are not limited to these specific examples.

[Uniaxial Crystal and Single Crystal]

A uniaxial crystal written in this specification is a crystal that has a single crystal orientation in the film thickness direction, and the film in-plane direction of a crystal is not especially limited. FIGS. 3A and 3B are diagrams showing patterns obtained when pole measurement is performed for a {110} asymmetrical plane by using X-ray diffraction. The uniaxial crystal <100> PZT perovskite type structure is shown in FIG. 3A, and the <100> single crystal PZT perovskite type structure is shown in FIG. 3B.

For example, the <100> uniaxial crystal is a film formed of a crystal, for which the film thickness direction is only a <100> orientation. By using X-ray diffraction, it can be confirmed that the piezoelectric film is uniaxial crystal. For example, in the case of a <100> uniaxial crystal of a PZT perovskite type structure, only peaks on the (L00) plane (L=1, 2, 3, . . . , n: n is an integer), such as {100} or {200}, are detected due to the piezoelectric film that has been obtained through a 2θ/θ measurement using the X-ray diffraction. Also, when pole measurement for the {110} asymmetrical plane is conducted, as shown in FIG. 3A, a ring-shaped pattern is obtained at the same radial position that represents an inclination of about 45° from the center.

A single crystal written in this specification indicates a crystal that has one crystal orientation in the film thickness direction and the film in-plane direction. For example, a <100> single crystal is a film, formed of a crystal, for which the film thickness direction is only a <100> orientation and one of the film in-plane directions is only a <110> orientation. Using X-ray diffraction, it can be confirmed that the piezoelectric film is uniaxial crystal. For example, in the case of <100> single crystal of a PZT perovskite type structure, only peaks on the (L00) plane (L=1, 2, 3, . . . , n: n is an integer), such as {100} or {200}, are detected due to the piezoelectric film that has been obtained through 2θ/θ measurement using the X-ray diffraction. Also, when a pole measurement for the {110} asymmetrical plane is conducted, as shown in FIG. 3B, a fourfold-symmetric spot-like pattern is obtained every 90° at the same radial positions representing an inclination of about 45° from the center.

For example, when a pole measurement of the {110} asymmetrical plane is performed for some <100> oriented crystals of a PZT perovskite type structure, eightfold- or twelvefold-symmetric pattern is obtained at the same radial positions representing an inclination of about 45° from the center. There is also a crystal, for which an elliptical pattern is obtained instead of a spot-shaped pattern. Since these crystals are those having an intermediate symmetry of the single crystal and the uniaxial crystal of this invention, these crystals are also regarded as single crystals or uniaxial crystals, in a broad sense. Similarly, when, for example, a monoclinic and a tetragonal, a monoclinic and a rhombohedral, a tetragonal and a rhombohedral, or multiple crystal phases of them are intermingled (mixed), or when crystal due to twin crystal exists together, or when a dislocation or a line defect is present, these crystals are regarded as single crystals and uniaxial crystals, in a broad sense.

[Electrode]

For the piezoelectric device in this mode, a pair of electrodes (an upper and a lower) are arranged so that they face and contact a piezoelectric member.

An arbitrary conductive material can be employed for the upper and lower electrodes, so long as an electric field can be effectively applied to a piezoelectric member. Further, the lower and upper electrodes can be a multilayer structure. For example, metals, such as Au, Pt, Ir, Al, Ti and Ta, or metal oxides, such as $IrO_2$ and $RuO_2$, can be employed. Preferably, for one of the upper and lower electrodes, especially, for the lower electrode, a conductive oxide layer is included. That is, the following can be said for the control of the crystal state of the piezoelectric member of the piezoelectric device, specifically, for adjusting the state to the uniaxial crystal state or the single crystal state. When a piezoelectric device is formed in the order vibration plate, lower electrode, piezoelectric member and upper electrode, or in the order vibration plate, buffer layer, lower electrode, piezoelectric member and upper electrode, the crystal structure of the lower electrode is important to the control of the crystal state of the piezoelectric member.

At this time, a conductive oxide material can be appropriately employed for the lower electrode. Example materials can be $SrTiO_3$ doped with La or Nb, $SrRuO_3$, $BaPbO_3$, $LaNiO_3$ or $Pb_2Ir_2O_7$.

Further, it is preferable that for the lower electrode include two or more conductive oxide layers be included. This structure has the same definition as described above when a buffer layer is made of a conductive oxide material, and it is possible to adjust, to obtain a more satisfactory state, the crystal structure of the piezoelectric member, the property of which is greatly affected by controlling the crystal structure.

Furthermore, the crystal structure of the upper electrode is important when a piezoelectric device is to be formed, using a transfer method, in the order upper electrode, piezoelectric member and lower electrode, and the metal oxide materials described above for the lower electrode are employed.

The minimum thickness required to maintain conductivity, so as to effectively apply an electric field to the piezoelectric member, is determined for the upper and lower electrodes. For this determination, the conductivity of an electrode material and the dimensions of the piezoelectric device are employed.

The maximum thickness is not especially limited because the lower electrode can also serve as the vibration plate for a bending mode piezoelectric device. However, the upper electrode is preferably thin because a load in only the transverse vibration mode is imposed to the upper electrode.

When the lower electrode does not serve as the vibration plate, the optimal thicknesses of both the lower and the upper electrodes are from 10 nm to 1 μm.

[Vibration Plate]

In the piezoelectric device for this mode, a vibration plate may be provided to one of the electrodes (the lower electrode). The vibration plate is a requisite component for a bending mode piezoelectric device, used in order to effectively displace the piezoelectric member in a transverse vibration mode.

The main components employed for the vibration plate may be oxide compounds, such as $ZrO_2$, $BaTiO_3$, $MgO$, $SrTiO_3$ and $MgAl_2O_4$, that are doped with a rare earth element including Sc or Y, and/or Si. Si may contain a dorpant element, such as B. A vibration plate that contains these materials as the main components includes a specifically controlled crystal structure. It is preferable that a <100>, <110> or <111> crystal structure be oriented at a strength of 80% or higher, because the polarization axial direction of the piezoelectric member is aligned with a drive electric field to be applied, and stable displacement is obtained when used for the piezoelectric actuator. More preferably, the strength is 99% or higher, up to 100%. Here, "99%" indicates that there is an orientation that differs from the primary orientation by 1%, according to the XRD strength.

More preferable is for the vibration plate to have a <100> uniaxial crystal or single crystal structure. This is so because, since the polarization axial direction of the piezoelectric member matches the direction of a drive electric field to be applied, a stable, large displacement can be obtained.

Additionally, it is preferable that a stable, chemically bonded oxide layer be provided to the surface of a vibration plate because, when in use, various materials may contact a vibration plate, such as when a vibration plate is a part of a liquid discharge apparatus that discharges image forming ink.

[Buffer Layer]

When the crystal state of the piezoelectric member of the piezoelectric device is to be controlled, specifically, when the crystal state is to be adjusted to the uniaxial crystal state or the single crystal state, a buffer layer may be formed between the vibration plate and the lower electrode in order to compound the piezoelectric member with the uniaxial crystal state or the single crystal state. Further, a plurality of such buffer layers may be formed.

It is preferable that the lattice constant, of a material for a buffer layer match lattice constant for a substrate, be within a range of 8% or smaller. It is further preferable that the buffer layer be an oxide compound deposited by using sputtering, the MOCVD method or a laser ablation method, and include the structure of a cubic crystal or a pseudocubic crystal having a lattice constant of 3.6 to 6.0 Å.

A specific structure can be, for example, 10% $Y_2O_3$—ZrO2 (100)/Si(100), 10% $Y_2O_3$—$ZrO_2$ (111)/Si(111), $SrTiO_3$(100)/MgO(100), $MgAl_2O_4$(100)/MgO(100) or $BaTiO_3$(001)/MgO(100). The lattice constants of 10% $Y_2O_3$—$ZrO_2$, $SrTiO_3$, MgO, $MgAl_2O_4$, $BaTiO_3$ and Si are respectively 5.16 Å, 3.91 Å, 4.21 Å, 4.04 Å, 3.99 Å and 5.43 Å. Commensuration of the lattice constants of, for example, 10% $Y_2O_3$—$ZrO_2$ (111)/Si(111) is calculated as follows. The commensuration of the lattice constant of 10% $Y_2O_3$—$ZrO_2$ (111) is $5.16 \times \sqrt{2} = 7.30$ Å, and the commensuration of the lattice constant of Si(111) is $5.43 \times \sqrt{2} = 7.68$ Å. Thus, since a commensuration difference is 4.9%, it is found that satisfactory commensuration is obtained.

[Piezoelectric Member Compounding/Deposition Method]

An appropriate method for compounding/depositing the piezoelectric member of this mode can be a so-called thin film deposition method, such as a sol-gel process, a hydrothermal combining method, a sputtering method, an MBE method, a PLD method, a CVD method or an MOCVD method. This thin film deposition method is a compounding/deposition method appropriate for the forming of a film having a thickness of the 10 nm to 10 μm order. Above all, MOCVD is especially appropriate.

While referring to the drawings, an explanation will now be given for the MOCVD method, which is an example piezoelectric member compounding/deposition method for the piezoelectric device of this mode.

Figure 4:
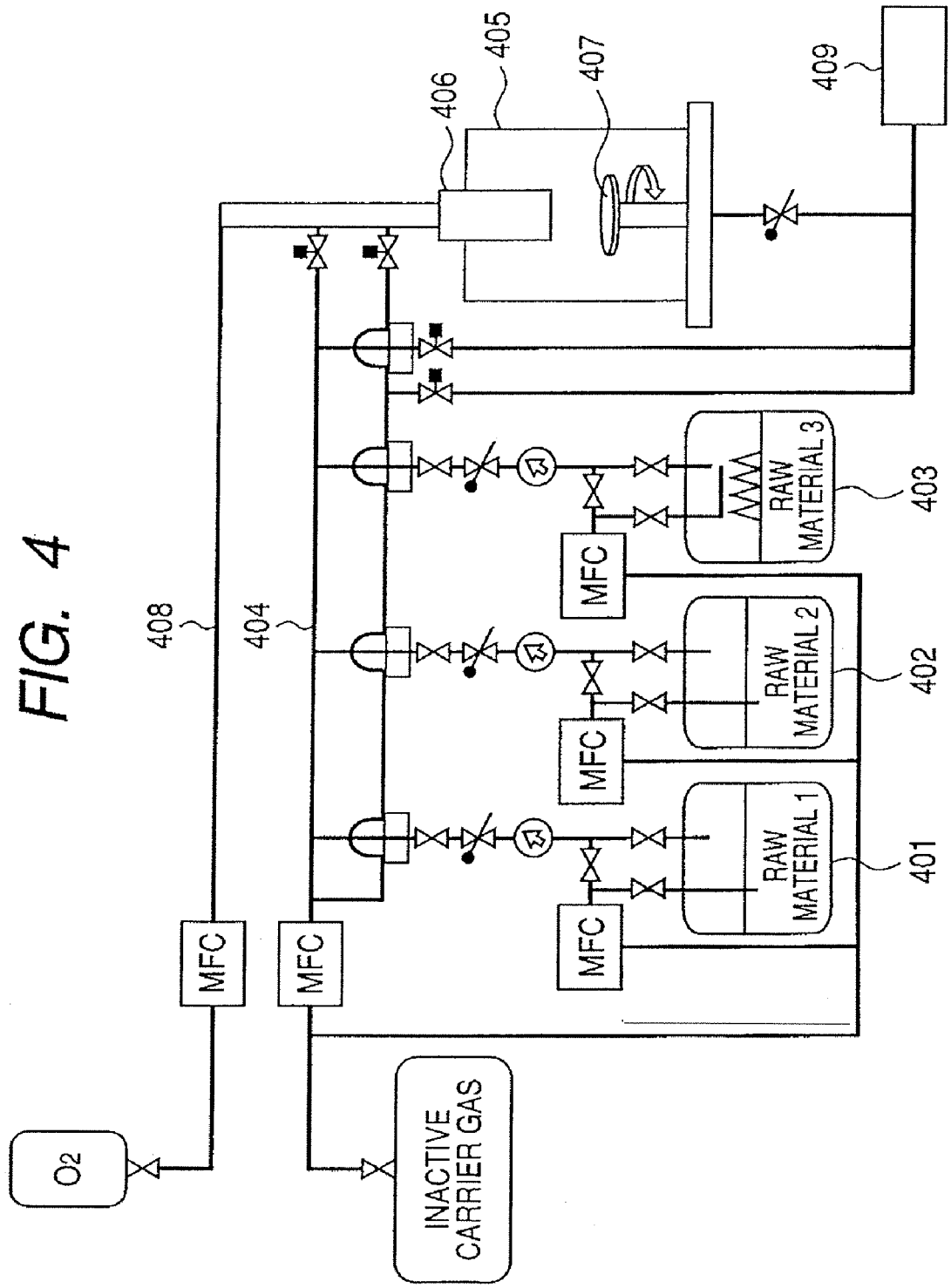
FIG. 4 is a schematic diagram showing the structure/mechanism of an MOCVD apparatus.

FIG. 4 is a schematic diagram showing the arrangement and mechanism for an MOCVD apparatus. Starting materials to be combined for film deposition are stored in starting material storage units 401, 402 and 403. Heaters (not shown) are provided for the starting material storage units 401, 402 and 403 that, adjust the partial pressures of the starting materials optimized by using an inactive carrier gas, in these storage units.

When the starting materials are liquids, an inactive carrier gas is supplied to the starting material storage units 401, 402 and 403 to perform bubbling, so that a mixture of the gases of the starting materials and an inactive carrier gas are efficiently generated.

When the starting materials are solid, the inactive carrier gas is applied directly onto the surfaces of the materials, and a mixture of the gases of the starting materials and the inactive carrier gas is efficiently generated.

The gases of the starting materials and the inactive carrier gas, the partial pressures and the flow rates of which are adjusted in accordance with the composition of the target film material to be deposited, are conveyed through a starting material mixed gas supply path 404 and are mixed together. Then, via a nozzle 406 in a reaction chamber 405, the resultant starting material mixed gas is applied onto a substrate that is mounted on a substrate holder 407. For the deposition of an oxide, a raw material oxygen gas is supplied to the nozzle 406 through an oxygen gas supply path 408. Then, before being supplied to the nozzle 406, the oxygen gas is mixed with an inactive carrier gas, and not only the air flow rate but also the partial pressure of the oxygen is adjusted, so that the amount of oxygen supplied during the compounding/deposition process can be controlled.

According to this arrangement, a gas mixture of an inactive carrier gas and starting material can also be intermittently supplied.

Further, a heater (not shown) is additionally provided for the substrate holder 407 to control the film deposition temperature, and a rotation mechanism is also arranged to uniformly perform the film deposition.

A pressure-reducing device 409 is connected to the reaction chamber 405 to control the pressure in the reaction chamber 405 during the film deposition process.

When using the MOCVD method, a well known starting material, used for depositing a film PZT material using the MOCVD method, can be employed and is not especially limited, and an arbitrary evaporative organic metal compound, containing a metal that provides a PZT material, can be employed. Generally, an alkyl metallic compound, an alkoxy metallic compound, an alkyl alkoxy metallic compound, a diketone compound, a cyclopentadienyl compound or halide is employed.

When $((CH_3)_3CCO)_2CH$— is represented as thd, a Pb raw material can be, for example, $Pb(C_2H_5)_4$, $Pb(thd)_2$, $(C_2H_5)_3PbOCH_2C(CH_3)_3$, $Pb(C_2H_5)_3(t\text{-}OC_4H_9)$, $Pb(CH_3)_4$, $PbCl_4$, $Pb(n\text{-}C_3H_7)_4$, $Pb(i\text{-}C_3H_7)_4$, $Pb(C_6H_5)_4$ or $PbCl_2$. The Zr raw material can be $Zr(t\text{-}OC_4H_9)_4$, $Zr(i\text{-}C_3H_7)_4$, $Zr(thd)_4$, $ZrCl_4$, $Zr(C_5H_5)_2Cl_2$, $Zr(OCH_3)_4$, $Zr(OC_2H_5)_4$, $Zr(n\text{-}OC_5H_{11})_4$ or $Zr(C_2H_6O_2)_4$. The Ti raw material can be $Ti(i-OC_3H_7)_4$, $Ti(thd)_2(i-OC_3H_7)_2$, $Ti(OC_2H_5)_4$, $TiCl_4$, $Ti(OCH_3)_4$, $Ti(OCH_9)_4$ or $Ti(OC_5H_{11})_4$.

Further, for PZT, one part of PB is replaced with La and the like. In this case, the La raw material can be, for example, $La(thd)_3$, $La(C_2H_6O_2)_4$ or $LaCl_3$.

The Mg raw material to be employed is $Mg[6-C_2H_5-2,2-(CH_3)_2-C_{10}H_{15}O_2]_2$ or $Mg(thd)_2$, and the Nb raw material to be employed is $Nb(C_2H_5)_5$, $NbC_3H_7(C_2H_5)_4$ or $Nb(O-iC_3H_7)_5$.

Since most of these raw materials not only have a toxification problem but are also solids or liquids at room temperature and have low vapor pressures, these materials should be heated to increase the vapor pressures.

In order to uniformly introduce the starting material mixed gas to the reaction chamber 405, it is preferable that the individual raw materials be mixed before the gas is introduced. It is also preferable that the temperature along the starting material supply paths be controlled so as to prevent the progression, in a pipe, of an oxide reaction that can impede single crystal film deposition. For example, in accordance with the raw material type, the heating temperature for the PZT can be 30 to 250° C.

Film deposition can be performed without substrate rotation. However, when substrate rotation is to be performed, it is preferable that the rotation be adjusted so that it is within a range of from 0.01 rpm to 100 rpm.

Specifically, Ar, $N_2$ or He, or a mixture of these gases can be employed as an inactive carrier gas. The flow rate for this inactive carrier gas is adjusted so it is within a range of from 10 $cm^3$/min to 1000 $cm^3$/min.

Preferably, a period for the bubbling of a liquid raw material before performing film deposition is five minutes to two hours, in accordance with the structure of an apparatus, and more preferably, is ten minutes to one hour. When film deposition is started without setting this period, deterioration of the composition control for the initial formation of a film will occur.

An oxygen gas or an oxygen/inactive gas mixture is employed as an oxide gas, and the flow rate for this gas can be adjusted so it ranges from 10 $cm^3$/min to 5000 $cm^3$/min.

Through the above described control provided for the flow rates of the individual gases, film deposition can be performed under a total pressure of from 0.05 to 100 torr in the reaction chamber 405.

Therefore, although the film deposition speed is not limited to a specific value, it will fall within an appropriate range of from 0.1 μm/hr to 5 μm/hr, for example, and stable film deposition can be performed.

[Liquid Discharge Head]

Figure 5:
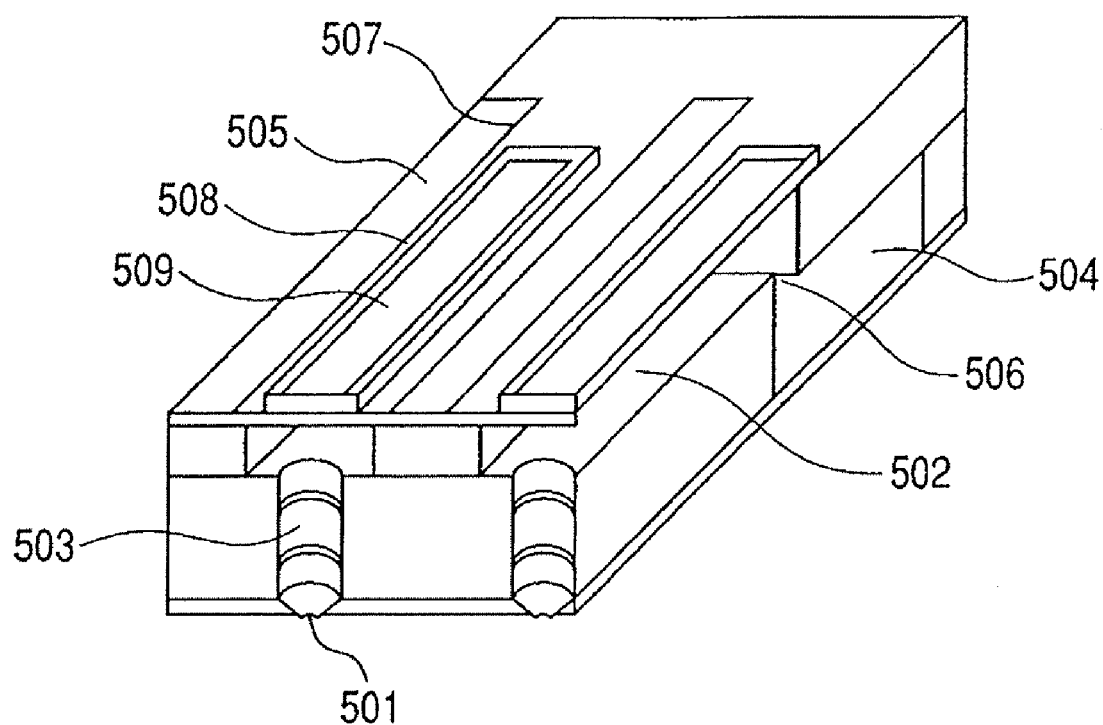
FIG. 5 is a schematic diagram showing an ink jet head employing a piezoelectric device according to one mode of the present invention.

While referring to FIG. 5, an explanation will now be given for an overview of a liquid discharge head that employs the piezoelectric device of this mode. FIG. 5 is a schematic diagram showing an example structure for an ink jet head, a liquid discharge head, comprising: discharge ports 501; separate liquid chambers 502; communication openings 503 which connect the separate liquid chambers 502 and the discharge ports 501; a common liquid chamber 504; and a constraint portion 506, for controlling an ink stream that flows between the separate liquid chambers 502 and the common liquid chamber 504, a vibration plate 505, a lower electrode 507, a piezoelectric member 508, and an upper electrode 509. The shapes of these components are not limited to those shown in FIG. 5, as the example in FIG. 5 is merely an example wherein the piezoelectric device of this mode is applied for an ink jet head. It should be noted that the piezoelectric device in this example corresponds to a portion wherein the piezoelectric member 508 is sandwiched between the lower electrode 507 and the upper electrode 509, and a portion comprising the vibration plate 505 mounted on the lower electrode 507.

Figure 6:
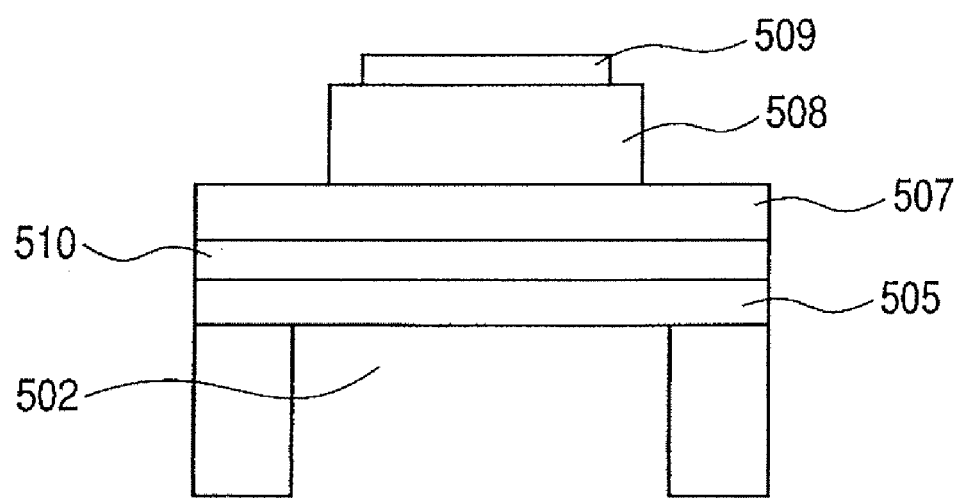
FIG. 6 is a widthwise, cross-sectional view of a portion that includes a piezoelectric member shown in FIG. 5.

The portion related to the piezoelectric member 508 of this mode will be described in more detail while referring to FIG. 6. FIG. 6 is a widthwise cross-sectional view of a portion that includes the piezoelectric member 508 in FIG. 5. An intermediate layer 510, for example, which serves as a buffer layer that controls crystallinity, may be formed between the vibration plate 505 and the lower electrode 507. This intermediate layer 510 may include a multi-layer structure. Further, the lower electrode 507 and the upper electrode 509 also have multi-layer structures that include layers for improving the adhesion of layers. The rectangular shape of the piezoelectric member 508, in cross section, is shown in FIG. 6; however, the shape in cross section is not limited to the one shown.

The lower electrode 507 is extended to a portion wherein the piezoelectric member 508 is not present, and the upper electrode 509 is extended to the side (not shown) opposite to the lower electrode 507, and is connected to a driving power source. The patterned state of the lower electrode 507 is shown in FIGS. 5 and 6; however, the lower electrode 507 may also be present in an area wherein the piezoelectric member 508 is not present.

For the ink jet head of this mode, it is preferable that the thickness of the vibration plate 505 be 1.0 to 10 μm, because this matches the order for the thickness of the piezoelectric member 508 that is to be used, and the displacement in the transverse vibration mode can be effectively extracted.

More preferably, the thickness of the vibration plate 505 is 1.0 to 6.0 μm. And when a buffer layer 510 is present, the thickness of the buffer layer 510 is included in this thickness. Preferably, the film thickness of the lower electrode 507 and the upper electrode 509 is 0.05 to 0.4 μm, and more preferably, is 0.08 to 0.2 μm.

Figure 7:
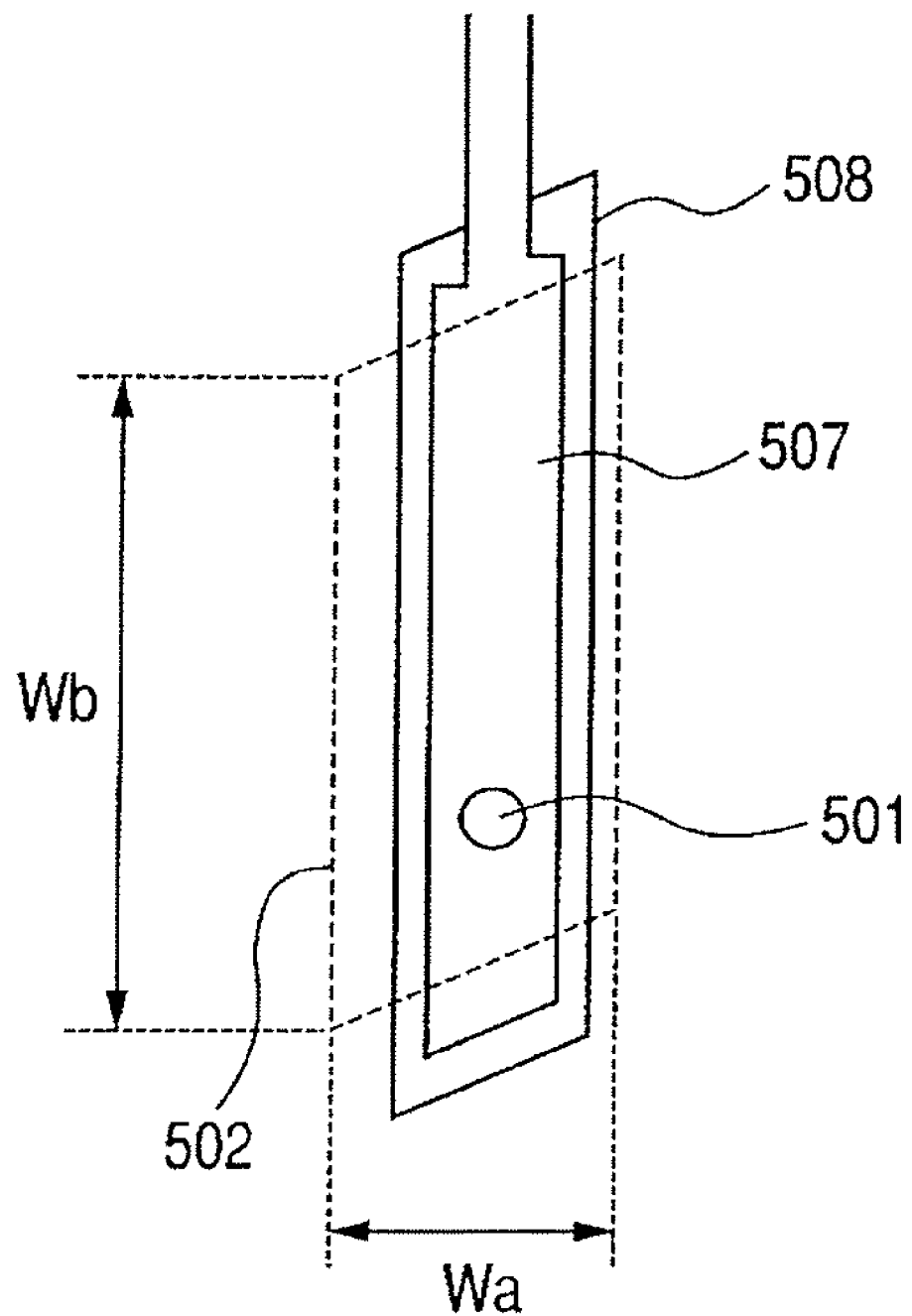
FIG. 7 is a diagram showing the structure of one unit of an ink jet head.

FIG. 7 is a diagram showing the structure of one portion, a unit of an ink jet head. A preferable width Wa for each separate liquid chamber 502 is 30 to 180 μm, and a preferable length Wb for the separate liquid chambers 502 is 0.3 to 6.0 mm, in accordance with the amount of liquid to be discharged as droplets. A circular shape is preferable for the discharge port 501, and for this, an appropriate diameter is 7 to 30 μm. It is preferable that the discharge ports 501 be tapered so they are enlarged toward the communication openings 503. An appropriate length of each communication opening 503 is 0.05 to 0.5 mm, for when the length exceeds this range, the speed at which a liquid droplet is discharged from the discharge port would be reduced. And further, when the length is reduced to less than that of the above range, there would be greater discrepancies at the speed at which a liquid droplet is discharged from each discharge port.

[Liquid Discharge Apparatus]

A liquid discharge apparatus employing the liquid discharge head according to this mode will now be described.

Figure 8:
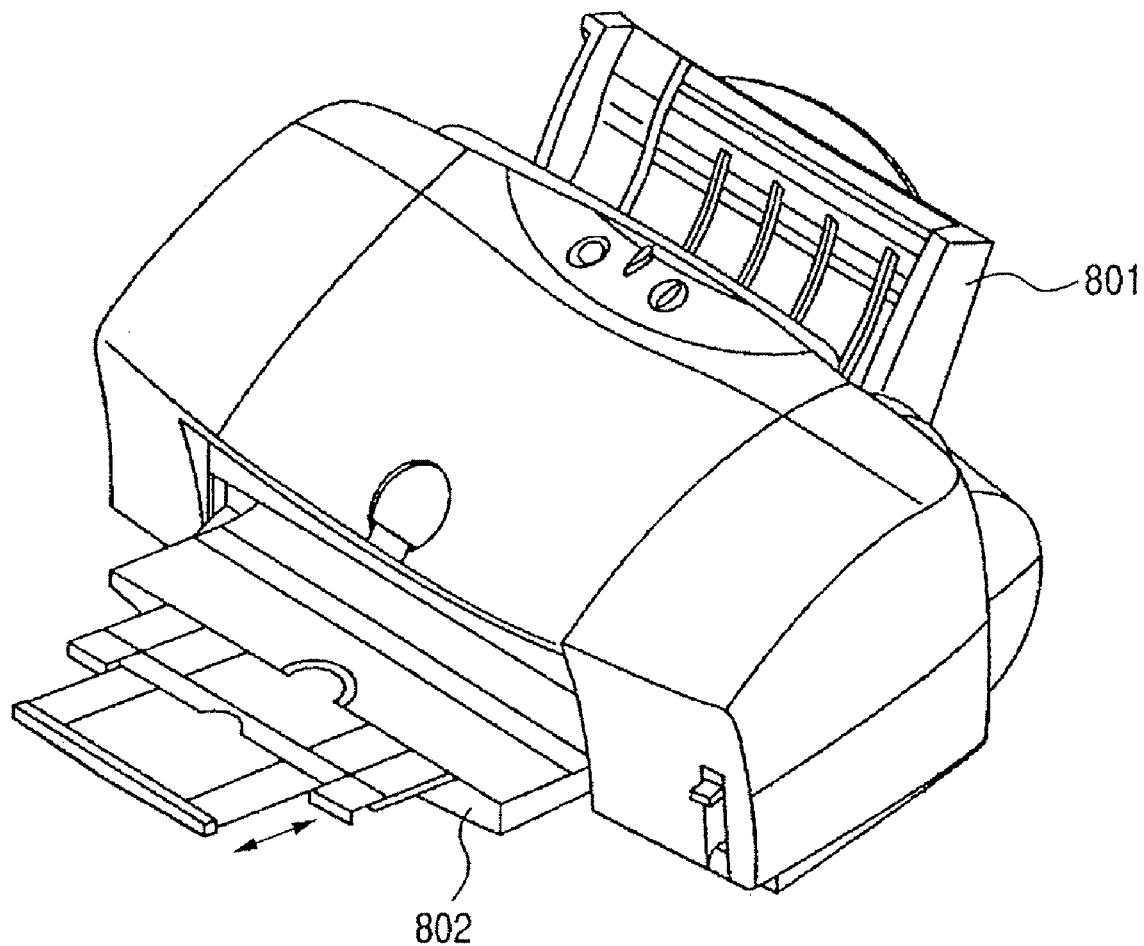
FIG. 8 is a schematic diagram showing an ink jet recording apparatus according to the mode.
Figure 9:
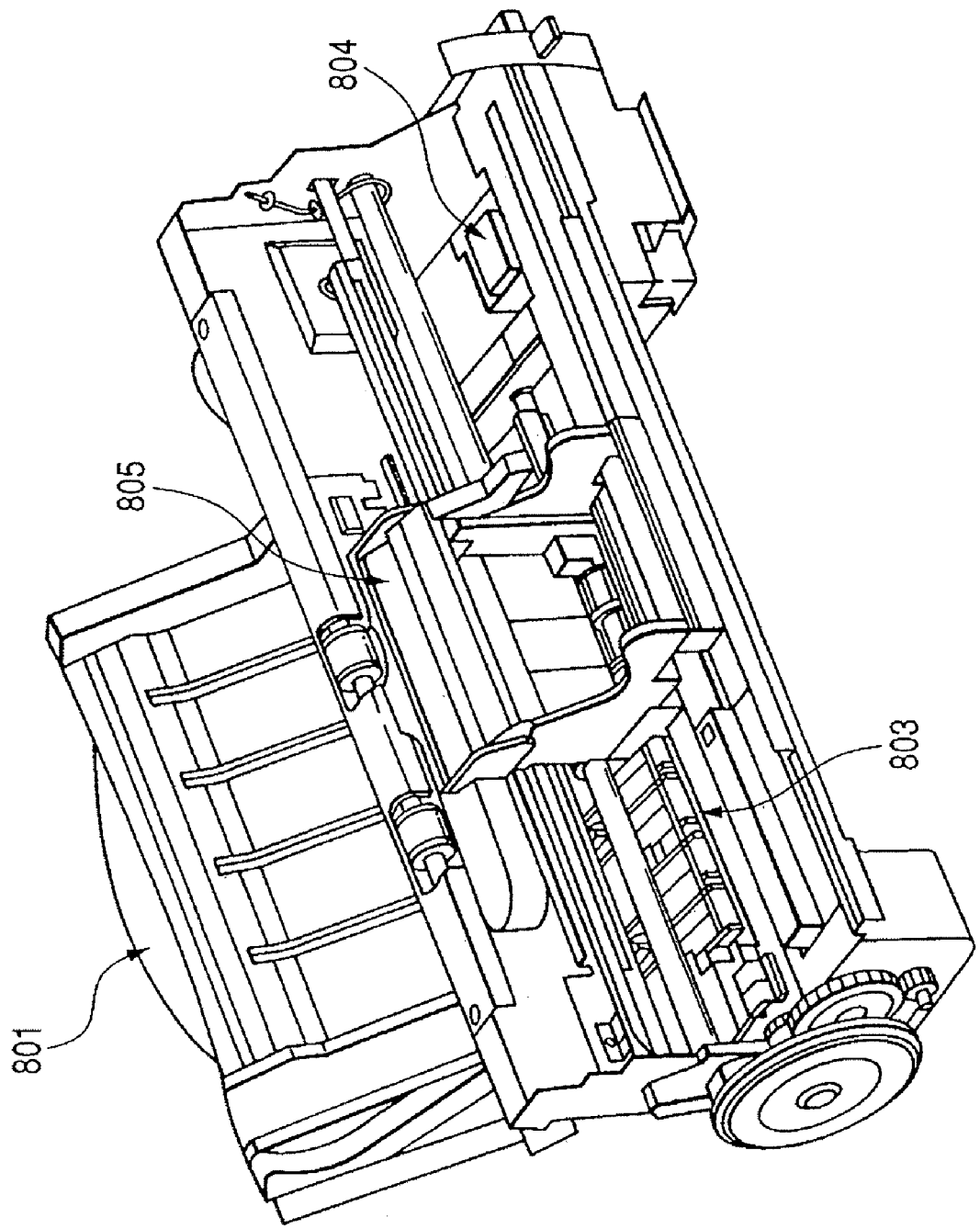
FIG. 9 is a schematic diagram showing an operating mechanism exposed by the removal of the external case of the ink jet recording apparatus in FIG. 8.

FIG. 8 is a schematic diagram showing an ink jet recording apparatus employing an ink jet head for which the piezoelectric device of this mode can be applied, and FIG. 9 is a schematic diagram of an operating mechanism in which the external case of the ink jet recording apparatus in FIG. 8 is not shown.

The ink jet recording apparatus comprises: an automatic feeding unit 801 for automatically feeding, to the main body of the apparatus, recording sheets that are used as the recording material; and a conveying unit 803 for guiding, to a predetermined recording position, a recording sheet fed by the automatic feeding unit 801, and for guiding the recording sheet from the recording position to a discharge port 802. The ink jet recording apparatus also includes: a recording unit, for performing the recording of the recording sheet conveyed to the recording position; and a recovery unit 804, for performing a recovery process for the recording unit. For use, the ink jet head of this mode is located in a carriage 805.

An example wherein the piezoelectric device is applied for a printer is shown as the mode for the present invention; however, the piezoelectric device may also be employed for a facsimile machine, a multifunctional apparatus, a copier, or an industrial discharge apparatus.

Embodiments

First Embodiment

First Embodiment of the present invention will now be described in detail while referring to the drawings.

FIGS. 10-1, 10-2, 10-3, 10-4, 10-5, 10-6 and 10-7 are cross-sectional structural views for explaining a process for the manufacture of an ink jet head that employs the piezoelectric device of the mode of this invention.

Figures 1, 10:
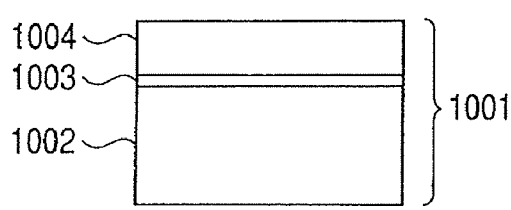
Figures 2, 10:
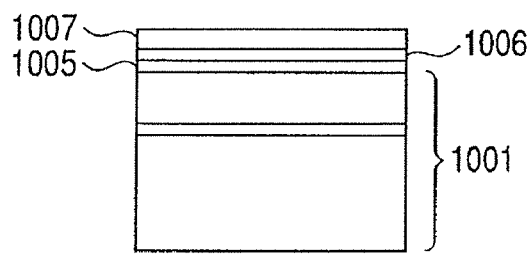

An SOI substrate 1001 was formed of an Si(100) substrate 1002 having a thickness of 200 μm, an $SiO_2$ layer 1003 having a thickness of 0.3 μm and an Si(100) layer 1004 having a thickness of 3 μm (FIGS. 10-1).

In an $Ar/O_2$ atmosphere, reactive sputtering was performed to deposit stabilized zirconium (10% $Y_2O_3$—$ZrO_2$: YSZ) at an SOI substrate temperature of 800° C., and a (100) YSZ epitaxial, 0.1 μm film 1005 was obtained as a buffer layer. Then, also in an $Ar/O_2$ atmosphere, sputtering was used to deposit $LaNiO_3$:LNO at a substrate temperature of 500° C., and a (100)LNO epitaxial, 0.1 μm film 1006 was obtained. Following this, in an $Ar/O_2$ atmosphere, sputtering was used to deposit $SrRuO_3$:SRO at a substrate temperature of 600° C., and a (100)SRO epitaxial, 0.2 μm film 1007 was obtained as a lower electrode (FIGS. 10-2). At this time, YSZ, LNO and SRO films were also deposited on the Si(100), 625 μm thick substrate in the same manner.

Figures 3, 10:
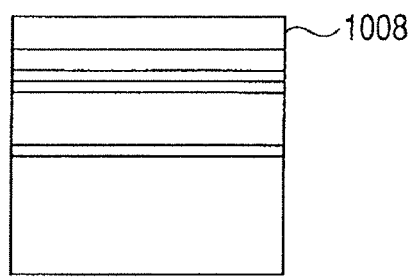
Figures 4, 10:
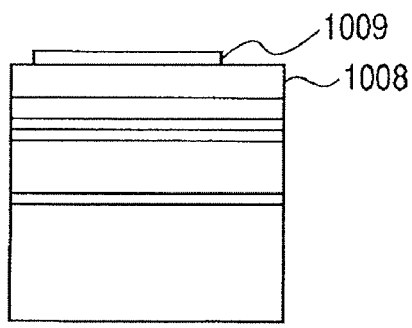
Figures 5, 10:
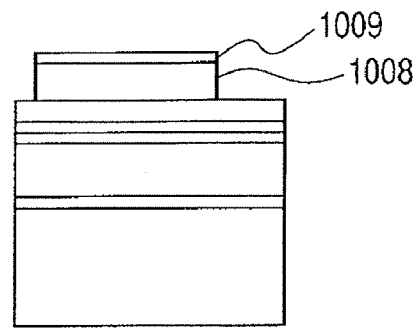
Figures 6, 10:
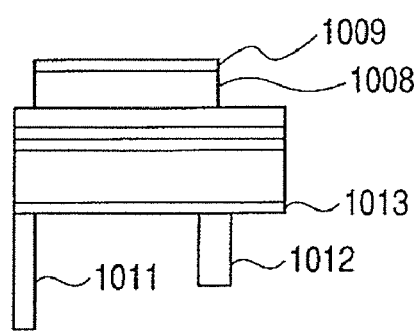
Figures 7, 10:
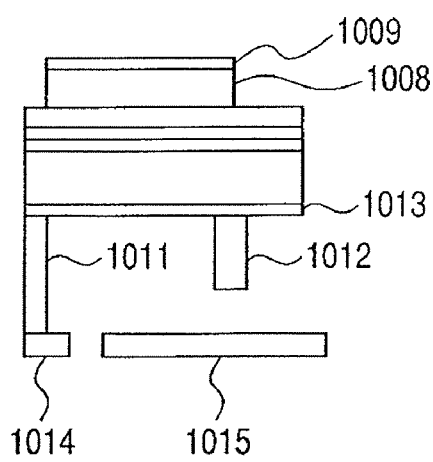

Next, using the MOCVD method, a 3 μm, $(Pb(Mn_{0.33}, Nb_{0.67})O_3)_{0.67}$—$(PbTiO_3)_{0.33}$(PMN-PT) film was deposited on the substrate as a piezoelectric member 1008 (FIGS. 10-3). The film deposition method will be described in detail below.

Figure 11:
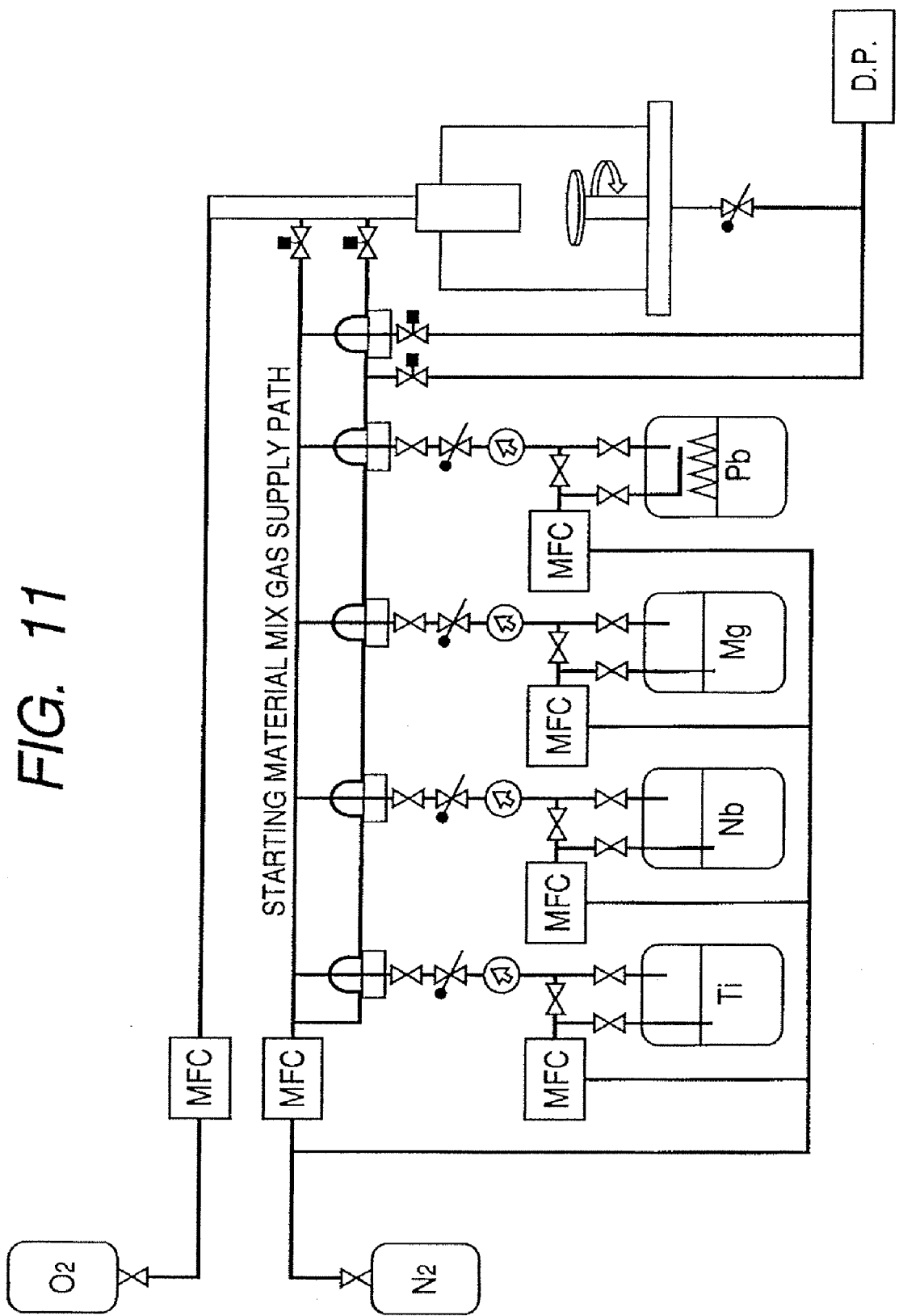
FIG. 11 is a diagram showing the structure of an MOCVD apparatus employed for depositing a piezoelectric member in first Embodiment of the present invention.

First, $Pb(thd)_2$: bis(hexamethylacetylacetonate) lead, $Mg[6-C_2H_5-2,2-(CH_3)_2—C_{10}H_{15}O_2]_2$: bis[6-ethyl-2,2-dimethyl-3,5-decandionate]magnesium, $NbC_3H_7 (C_2H_5)_4$: propyltetraethylniobium, and $Ti(C_3H_7O)_4$: titanium tetraisopropoxide were prepared as starting materials, and a piezoelectric member was deposited using an MOCVD apparatus having an arrangement as shown in FIG. 11. The basic arrangement in FIG. 11 is the same as that shown in FIG. 4, and the conditions for the film deposition are as follows.

The individual starting materials were heated, and the gases generated by heating these materials were mixed with a nitrogen ($N_2$) gas that was used as an inactive carrier gas, and the mole fraction of the individual starting gases in the path for supplying the mixture of the inactive carrier gas and the gases of the starting materials was adjusted in accordance with a target film composition. Also, the amount of oxygen $O_2$ supplied was set to 15 [$m^3$/min], and excessive amounts of the Pb raw material and $O_2$ raw material were set for the composition of the resultant film.

In this embodiment, the pulse MOCVD method for intermittently supplying raw materials was employed.

Figure 12:
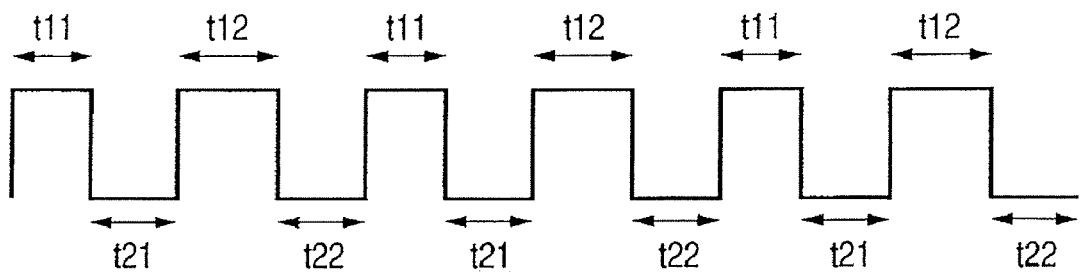
FIG. 12 is a diagram showing a time sequence for a pulse MOCVD method according to first Embodiment.

According to the pulse MOCVD method, compounding and film deposition was performed by alternatedly setting a time $t_1$ during which a gas generated by mixing, with oxygen, a mixture of an inactive carrier gas and the gases of starting materials was applied from nozzles onto a film deposition substrate, and a time $t_2$ during which the supply of a mixture of the inactive carrier gas and the gases of the starting materials was halted. In this embodiment, two standard periods $t_{11}$ and $t_{12}$, and $t_{21}$ and $t_{22}$ were respectively designated as the time $t_1$ and $t_2$ during which a gas obtained by mixing the oxygen gas with the mixture of the inactive carrier gas and the gases of the starting materials was applied from nozzles onto the film deposition substrate. The time sequence for the standard periods $t_{11}$, $t_{12}$, $t_{21}$ and $t_{22}$ is shown in FIG. 12. The compounding and film deposition was performed by employing the time sequence in FIG. 12.

The respective periods were $t_{11}$=10 [sec], $t_{12}$=25 [sec], $t_{21}$=5 [sec] and $t_{22}$=20 [sec].

For the periods $t_{11}$ and $t_{12}$, during which raw materials were supplied, the pressure in the reaction chamber was 8.5 [torr], and the partial pressure of the oxygen was 6.0 [torr].

Then, the film deposition substrates (SOI and Si) were placed on the substrate holder, and the film deposition substrate temperature was adjusted to 650° C. Sequentially, thereafter, the compounding and the film deposition was performed by rotating the substrate holder at a speed of 2.0 rpm.

When the crystal structure analysis for the obtained piezoelectric member 1008 (PMN-PT) was performed, it was confirmed that PMN-PT on the SOI substrate and PMN-PT on the Si substrate were (100) single crystals that had been epitaxially grown on the substrates. In this case, a high resolution X-ray diffraction apparatus having four axes (XRD, PANalytical X'pert-MRD) was employed for the crystal structure analysis.

Further, when a composition analysis was performed for the piezoelectric member 1008 (PMN-PT), it was confirmed that the PMN-PT on the SOI substrate and the PMN-PT on the Si substrate were $(Pb(Mn_{0.33}, Nb_{0.67})O_3)_{0.67}$—$(PbTiO_3)_{0.33}$. In this case, a wavelength dispersive X-ray fluorescence analysis apparatus (XRF, PANalytical PW2404) was employed for the composition analysis.

Next, an ink jet head was fabricated by employing the SOI substrate wherein PMN-PT was deposited as the piezoelectric member 1008. The manufacturing process will be described below.

On the piezoelectric member 1008 formed on the SOI substrate 1001, a 200 nm thick layer of Au was deposited, using DC sputtering, as an upper electrode 1009 that was patterned and had a 0.15 mm×5 mm size that corresponded to the sizes of the separate liquid chambers of the ink jet head (FIGS. 10-4).

Following this, a dry etching process was performed, and the piezoelectric member 1008 was removed by employing the patterned upper electrode 1009 as a mask (FIGS. 10-5).

Then, a dry etching process was performed to make two-step etching to the Si substrate 1002 portion of the SOI substrate 1001, and separate liquid chambers 1011, a constraint portion 1012 and a common liquid chamber 1013 were obtained (FIGS. 10-6).

Sequentially, a nozzle plate 1015 having 30 μmφ discharge ports 1014 was glued to the SOI substrate 1001 using an organic adhesive. As a result, an ink jet head was completed (FIGS. 10-7).

To evaluate the performance of the ink jet head, the volume of ink discharged when the ink jet head was driven at 10 kHz was measured, and a change was evaluated between the amount of ink discharged immediately after the discharge process was started and the amount of ink discharged after the discharge durability test had been conducted $10^{10}$ times. When a difference in the discharged ink volume was less than 3% relative to the initial value, the evaluation was A. When there was a difference equal to or greater than 3% and less than 5%. the evaluation was B, and when there was a difference equal to or greater than 5%, the evaluation was C.

The obtained results are shown in Table 1.

An explanation will now be given for a method for the manufacture of a sample to be used to evaluate the piezoelectric constants $d_{33}$ and $d_{31}$ of a piezoelectric member that was compounded and deposited.

The following electrodes were deposited on the PMN-PT/SRO/LNO/YSZ/Si(100) substrate, on which PMN-PT was deposited as a piezoelectric member as well as on the SOI substrate used for manufacturing an ink jet head. That is, using DC sputtering, a 100 μmϕ Au electrode and a rectangular, 12 mm×3 mm Au electrode, each 100 nm thick, were deposited on the PMN-PT to be respectively used as a $d_{33}$ measurement electrode and a $d_{31}$ measurement electrode. At this time, the rectangular, 12 mm×3 mm Au electrode, which serves as a $d_{31}$ measurement electrode, was located so that the individual sides of the rectangle were parallel to the (010), (001), (01-0) and (001-) planes that are perpendicular to the (100) plane of the Si(100) substrate.

Figures 1, 13:
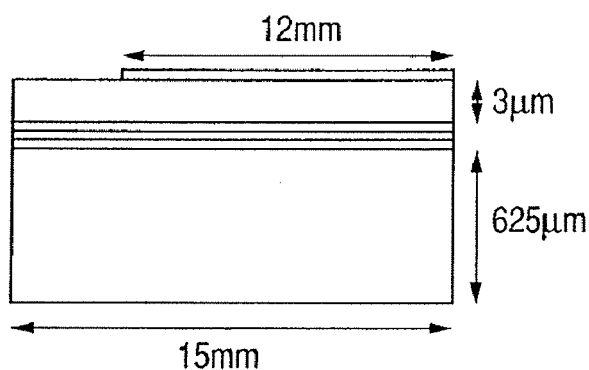
Figures 2, 13:
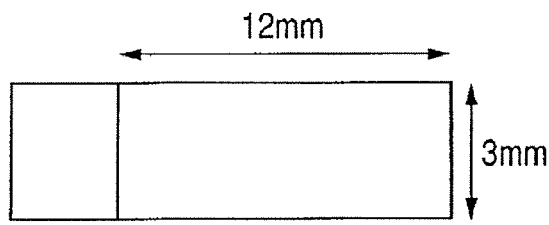

A $d_{31}$ measurement sample is shown in FIGS. 13-1 and 13-2. FIGS. 13-1 is a side view of the layer structure of the $d_{31}$ measurement sample after a cutting process is completed by a dicer, and FIGS. 13-2 is a top view of the obtained shape of the $d_{31}$ measurement sample.

A method for determining the piezoelectric constant $d_{33}$ will now be explained in detail.

[$d_{33}$ Measurement Method]

The piezoelectric constant $d_{33}$ was determined by employing together a scanning probe microscope (SPM), which is a general method for measuring an effect inducing strain on a thin film piezoelectric member, and a ferroelectric material tester. SPI-3800 (a product name of Seiko Instruments Co., Ltd.) was used as a scanning probe microscope, and FCE-1 (a product name of Toyo Technika Co., Ltd.) was used as a ferroelectric material tester.

Figure 14:
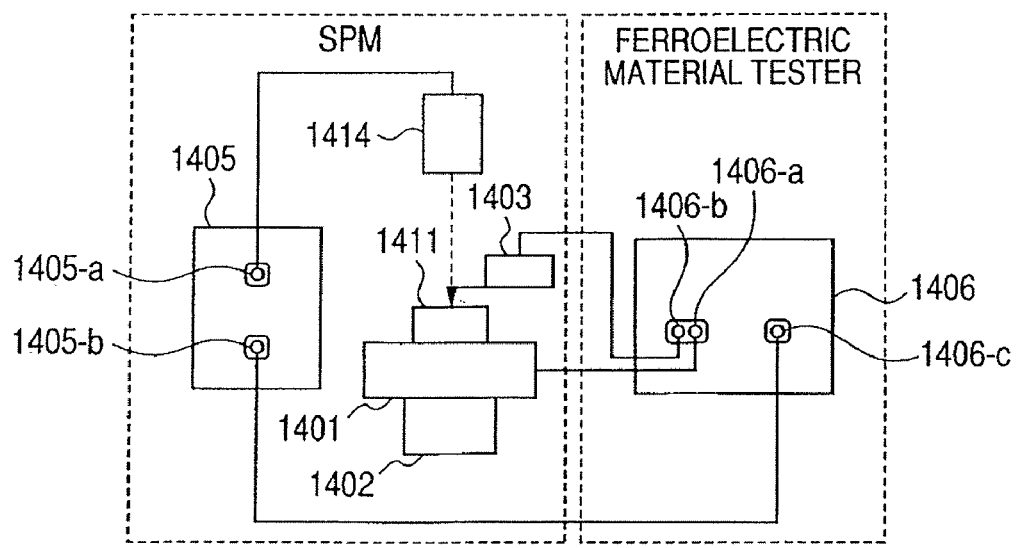
FIG. 14 is a schematic diagram showing a $d_{33}$ measurement apparatus.

FIG. 14 is a schematic diagram showing a $d_{33}$ measurement apparatus provided by using a scanning probe microscope and a ferroelectric material tester.

In FIG. 14, the SPM includes a sample table 1401, a sample table height adjustment actuator 1402, a cantilever 1403, a cantilever displacement detector 1404 and a controller 1405. The cantilever 1403 is moved in the X axial direction and in the Y axial direction (across the plane direction of a sample) (scanning), and the cantilever displacement detector 1404 detects the movement of the cantilever 1403 in the Z axial direction (the direction of height) so as to obtain, for example, the minute roughness on the surface of a sample. Based on the Z-axial movement of the cantilever 1403 detected by the cantilever displacement detector 1404, the controller 1405 determines a feedback Z axis control signal. A feedback Z axis control signal which is used to maintain the constant Z axial position of the cantilever 1403, is transmitted from a terminal 1405-b to the sample table height adjustment actuator 1402, so that the constant Z axial position of the cantilever 1403 can be maintained.

The ferroelectric material tester 1406 applies a voltage to the sample through terminals 1406-a and 1406-b, and monitors the current amount and the charge amount. Further, at a terminal 1406-c, the ferroelectric material tester 1406 fetches a feedback Z axial control signal from the SPM.

The SPM sample table 1401 is electrically in a floating state, and is connected to the voltage application side terminal 1406-a of the ferroelectric material tester 1406 as well as to the lower electrode of a $d_{33}$ measurement sample 1411. The Gnd side terminal 1406-b is connected to the SPM cantilever 1403 that is rendered conductive, and is connected to the upper electrode of the $d_{33}$ measurement sample 1411, in order to apply a voltage to the $d_{33}$ measurement sample 1411.

For a $d_{33}$ measurement, the cantilever 1403 is not moved in the X axial direction or in the Y axial direction (scanning), and is halted in either direction.

The piezoelectric constant $d_{33}$ of the piezoelectric member can be determined by measuring the displacement relative to an input voltage.

For the $d_{33}$ determination of this embodiment, a triangular wave of 10 Hz was applied to a sample as an input signal voltage, so that an electric field of 0 to 150 [kV/cm] was applied to the piezoelectric member (a voltage of 0 to 45 V was applied to the 3 μm thick piezoelectric film). A polarity such that the displacement was the maximum within the same electric field was selected.

Since the sample was extended or contracted by the application of the input signal voltage, the SPM scanned this displacement as a change in the Z axial direction.

The piezoelectric constant $d_{33}$ measured and determined by the above described means is shown in Table 1.

A method for determining a piezoelectric constant $d_{31}$ will now be explained in detail.

[$d_{31}$ Measurement Method]

A unimolph cantilever method was employed to determine a piezoelectric constant $d_{31}$.

Figures 1, 15:
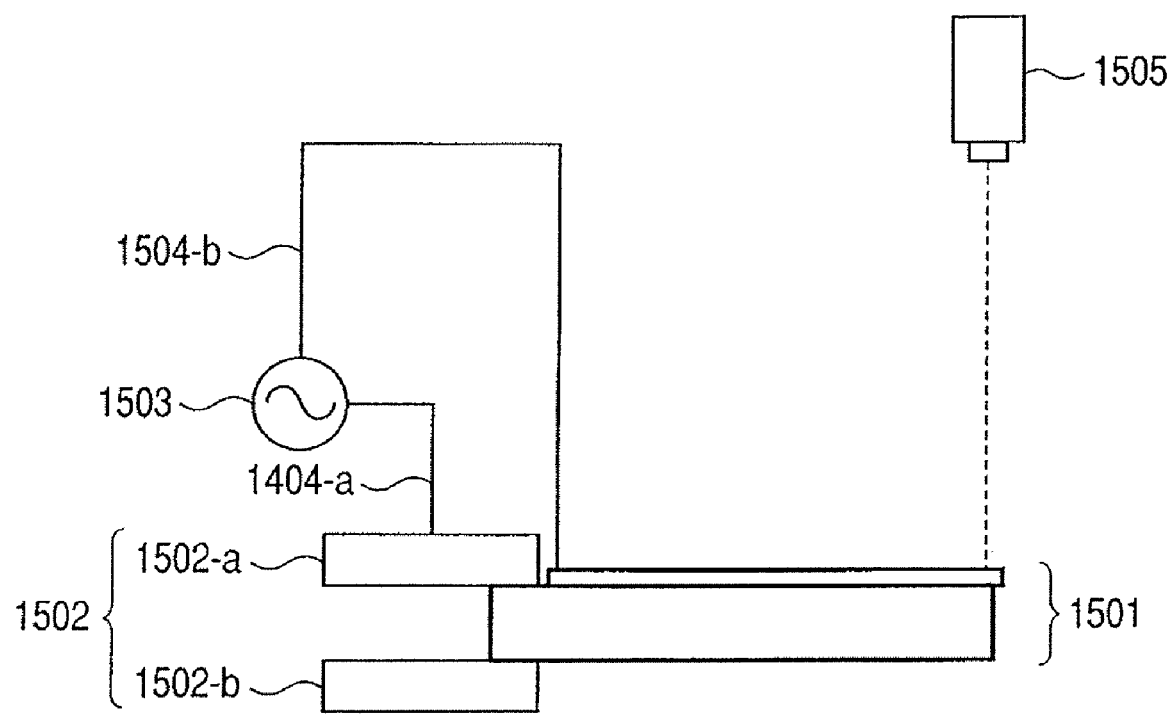
Figures 2, 15:
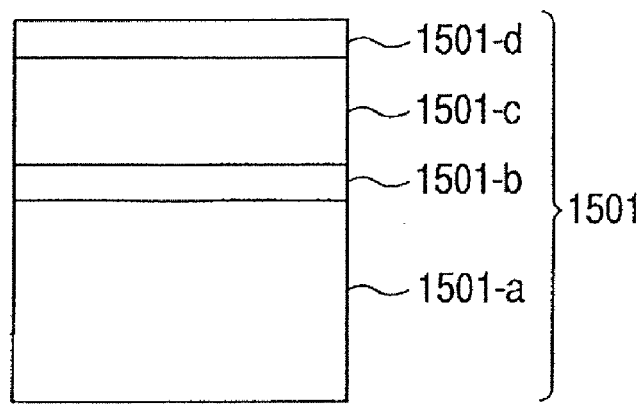

FIGS. 15-1 is a schematic diagram showing an apparatus for measuring a displacement of a unimolph cantilever, and FIGS. 15-2 is a schematic diagram showing the layer structure of a basic sample. Both diagrams are employed for explaining the $d_{31}$ measurement.

A piezoelectric device 1501 is provided by forming on a substrate 1501-a, in the named order, a lower electrode 1501-b, a piezoelectric member 1501-c and an upper electrode 1502-d, and has a unimolph cantilever structure, i.e., one side is fixed by a clamping jig 1502. An upper portion 1502-a of the clamping jig 1502, made of a conductive material, is electrically connected to the lower electrode 1501-b of the piezoelectric device 1501, and is also connected to one of the output terminals (not shown) of an AC power source 1503 by an electric cable 1504-a. The other output terminal (also not shown) of the AC power source 1503 is connected to the upper electrode 1501-d of the piezoelectric device 1501 via the electric cable 1504-b, and is used to apply an AC voltage to the piezoelectric member 1501-c of the piezoelectric device 1501.

The piezoelectric member 1501-c is extended or contracted by an electric field supplied by the AC power source 1503. Accordingly, the substrate 1501-a is distorted, and the piezoelectric device 1501 is vertically vibrated by employing, as a fulcrum, the end that is secured by the clamping jig 1502. Then, a laser Doppler velocimeter (LDV) 1505 monitors vibrations at the end of the piezoelectric device 1501 that is not clamped, and measures the displacement of the unimolph cantilever relative to an input electric field.

At this time, approximately, a relation represented by expression 1 is established for the displacement of the unimolph cantilever relative to an input voltage V (see non-patent document 2).

Expression 1 does not include material property terms, for example, for the lower electrode layer, the upper electrode layer and the buffer layer. However, when the thicknesses of these layers are very small relative to a substrate thickness $h^s$, the material properties and the film thicknesses of these layers can be ignored, and expression 1 can be employed as an approximate formula that is of practical use.

Based on expression 1, the displacement of the unimolph cantilever relative to the input electric field need only be measured, for the piezoelectric constant $d_{31}$ of the piezoelectric member 1501-c to be determined.

Expression 1

$$\delta = 3 d_{31} S_{11}{}^S S_{11}{}^P h^s (h^s + h^P) L^2 V / K \quad \text{Expression 1-1}$$

$$K = (S_{11}{}^S)^2 (h^P)^4 + 4 S_{11}{}^S S_{11}{}^P h^s (h^P)^3 + 6 S_{11}{}^S S_{11}{}^P (h^S)^2 (h^P)^2 + 4 S_{11}{}^S S_{11}{}^P (h^S)^3 h^P + (S_{11}{}^P)^2 (h^S)^4 \quad \text{Expression 1-2}$$

δ: displacement at the distal end of a cantilever
V: input voltage
L: length of a cantilever
$S_{11}{}^S$: substrate compliance (element of 11 direction)
$S_{11}{}^P$: piezoelectric member compliance (element of 11 direction)
$h^S$: thickness of a substrate
$h^P$: thickness of a piezoelectric member For a $d_{31}$ determination in this embodiment, a sin wave (sine curve) of 500 Hz was applied as an input signal voltage to the sample, so that an electric field of 0 to 150 [kV/cm] was applied to the piezoelectric member (a voltage of 0 to 45 V was applied to the 3 µm thick piezoelectric member). A polarity such that the displacement became the maximum was selected in the same electric field. This polarity was the same as that used for the determination of the piezoelectric constant $d_{33}$. The reason that the sin wave was employed as an input signal voltage was that, since the mass of the cantilever was large, the displacement δ at the distal end of the cantilever removed the inertial term of the vibrating motion.

The displacement δ at the distal end of the cantilever, upon the application of the signal voltage, was measured and $d_{31}$ was determined.

The material properties used in expression 1 were defined as:

$S_{11}{}^S = 7.7 \times 10^{-12}$ [m²/N]

$S_{11}{}^P = 70.2 \times 10^{-12}$ [m²/N].

The value described in non-patent document 3 was employed for $S_{11}{}^P$.

The obtained results are shown in Table 1.

Second Embodiment

A 2.8 µm piezoelectric member was deposited using a composition of $(Pb(Mn_{0.33}, Nb_{0.67})O_3)_{0.70}$—$(PbTiO_3)_{0.30}$. The other components were formed in the same manner as in first Embodiment, and an ink jet head and a sample for determining piezoelectric constants $d_{33}$ and $d_{31}$ were prepared. Then, evaluations for these performances were performed and the piezoelectric constants were determined. The obtained results are shown in Table 1.

Material properties employed in expression 1 were defined as:

$S_{11}{}^S = 7.7 \times 10^{-12}$ [m²/N]

$S_{11}{}^P = 51.2 \times 10^{-12}$ [m²/N]

Third Embodiment

By employing a YSZ (10% $Y_2O_3$—$ZrO_2$:YSZ) oxide target, sputtering was performed in an Ar/$O_2$ atmosphere at a substrate temperature of 800° C., and a YSZ(100) uniaxially oriented film of 0.1 µm was deposited as a buffer layer on an SOI substrate and an Si substrate, as was done in first Embodiment. Then, again in an Ar/$O_2$ atmosphere, but at a substrate temperature of 600° C., sputtering was used to deposit an SRO(100) uniaxially oriented, 0.2 µm film was deposited as a lower electrode.

Following this, a $(Pb(Mn_{0.33}, Nb_{0.67})O_3)_{0.67}$—$(PbTiO_3)_{0.33}$(PMN-PT), 3.0 µm film was deposited as a piezoelectric film.

At this time, periods $t_{11}$ and $t_{12}$ during which a gas obtained by mixing, with an oxygen gas, a mixture of an inactive carriage gas and gases of starting materials is applied from nozzles onto the film deposition substrate, and periods $t_{21}$ and $t_{22}$ during which the supply of the mixture of the inactive carrier gas and the starting materials is halted, were defined as $t_{11} = 10$ [sec], $t_{12} = 25$ [sec], $t_{21} = 10$ [sec] and $t_{22} = 25$ [sec].

When the PMN-PT crystal structure analysis for the piezoelectric member was performed, it was confirmed that the PMN-PT on the SOI substrate and the PMN-PT on the Si substrate were (100) uniaxially oriented films.

The components other than the piezoelectric member were prepared in the same manner as in first Embodiment, and an ink jet head and a sample for determining piezoelectric constants $d_{33}$ and $d_{31}$ were produced. Evaluation of the performance was performed and the piezoelectric constants were determined. The obtained results are shown in Table 1.

Material properties employed in expression 1 were defined as:

$S_{11}{}^S = 7.7 \times 10^{-12}$ [m²/N]

$S_{11}{}^S = 70.2 \times 10^{-12}$ [m²/N].

Fourth Embodiment

The film deposition substrates (SRO/YSZ/SOI and SRO/YSZ/Si) used in third Embodiment were prepared.

According to an MOCVD method for depositing a piezoelectric member, $Pb(thd)_2$, $Zr(O-t-C_4H_9)_4$ and $Ti(O-i-C_3H_7)_4$ were prepared as starting materials, and a $Pb(Zr_{0.5}, Ti_{0.5})O_3$ (PZT), 3.2 µm film was deposited.

At this time, periods $t_{11}$ and $t_{12}$, during which a gas obtained by mixing, with an oxygen gas, a mixture of an inactive carriage gas and gases of starting materials is applied through nozzles onto the film deposition substrate, and periods $t_{21}$ and $t_{22}$, during which the supply of the mixture of the inactive carrier gas and the starting materials is halted, were defined as $t_{11} = 10$ [sec], $t_{12} = 25$ [sec], $t_{21} = 15$ [sec] and $t_{22} = 20$ [sec].

When the PZT crystal structure analysis for the piezoelectric member was performed, it was confirmed that the PZT on the SOI substrate and the PZT on the Si substrate were (100) uniaxially oriented films.

The components other than the piezoelectric member were prepared in the same manner as in first Embodiment, and an ink jet head and a sample for determining piezoelectric constants $d_{33}$ and $d_{31}$ were produced. Evaluation of the performance was performed and the piezoelectric constants were determined. The obtained results are shown in Table 1.

Material properties employed in expression 1 were defined as:

$S_{11}{}^S = 7.7 \times 10^{-12}$ [m²/N]

$S_{11}{}^P = 12.4 \times 10^{-12}$ [m²/N].

Comparative Example 1

Using DC sputtering, Ti and Pt were deposited on an SOI substrate and an Si substrate that were used as film deposition substrates in first Embodiment, and Pt (150 nm)/Ti (5 nm)/SOI and Pt (150 nm)/Ti (5 nm)/Si were prepared.

For the film deposition of a piezoelectric film, a metal oxide ceramics target $Pb_{1.1}(Zr_{0.5}, Ti_{0.5})O_3$ was employed. Specifically, in an $Ar/O_2$ atmosphere, a piezoelectric film was deposited at a substrate temperature of 30° C., and the structure was burnt for two hours at 700° C. As a result, a $Pb(Zr_{0.5}, Ti_{0.5})O_3$(PZT) polycrystal, 3.0 μm thick film was obtained.

When the PZT crystal structure analysis for the obtained piezoelectric member was performed, it was confirmed that the PZT on the SOI substrate and the PZT on the Si substrate were non-oriented polycrystal films.

Components other than the piezoelectric member were prepared in the same manner as first Embodiment, and an ink jet head and a sample for determining piezoelectric constants $d_{33}$ and $d_{31}$ were produced. Evaluation of the performance was performed and the piezoelectric constants were determined. The obtained results are shown in Table 1.

Material properties employed in expression 1 were defined as:

$S_{11}{}^S = 7.7 \times 10^{-12}$ [m$^2$/N]

$S_{11}{}^P = 12.4 \times 10^{-12}$ [m$^2$/N]

TABLE 1

| | Piezoelectric member | $d_{33}$ | $|d_{31}|$ | $|d_{33}/d_{31}|$ | Discharge durability |
|---|---|---|---|---|---|
| First Embodiment | PMN-PT | 85 | 620 | 0.14 | A |
| Second Embodiment | PMN-PT | 80 | 450 | 0.18 | A |
| Third Embodiment | PNN-PT | 120 | 480 | 0.25 | A |
| Fourth Embodiment | PZT | 100 | 62 | 1.61 | B |
| Comparative Example 1 | PZT | 118 | 58 | 2.03 | C |

Figure 16:
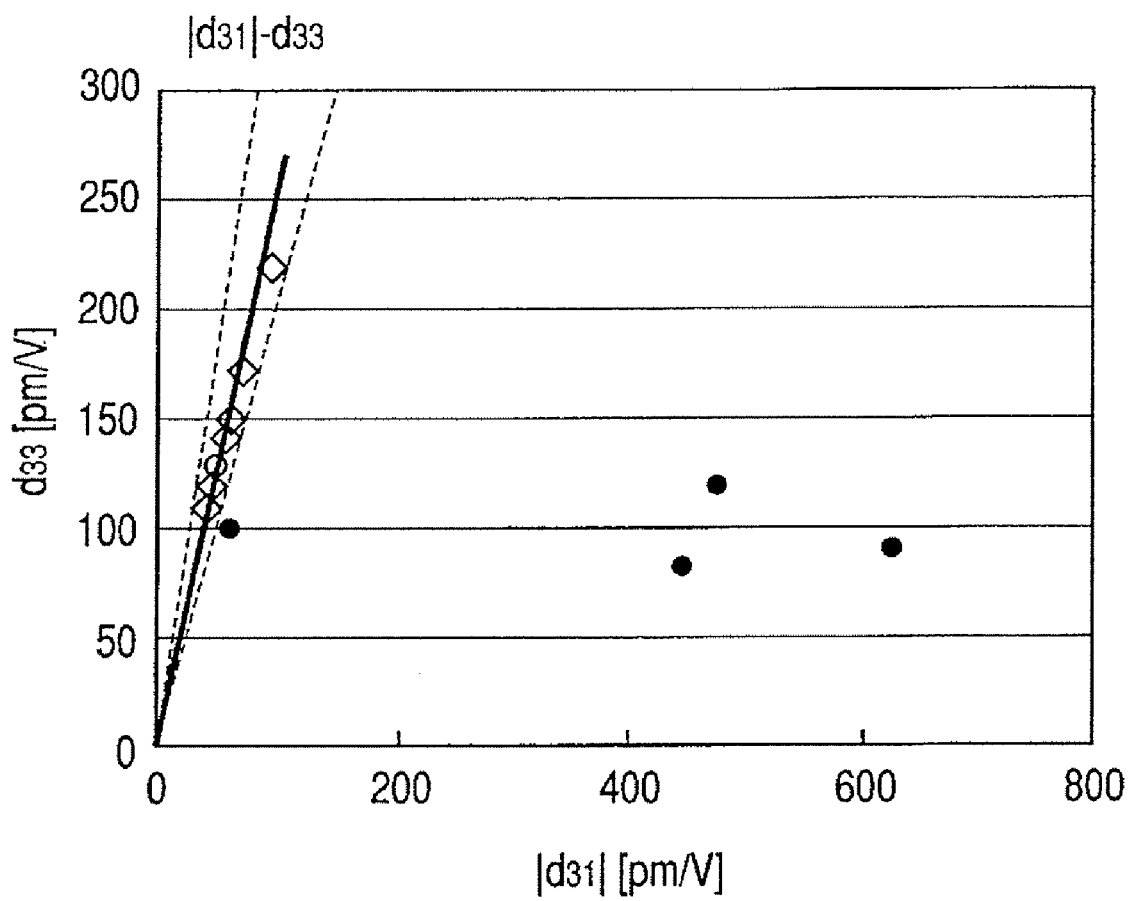
FIG. 16 is a graph showing a relation between $|d_{31}|$ and $d_{33}$ of a piezoelectric member related to a piezoelectric device according to the mode of the present invention.

FIG. 16 is a graph obtained by plotting relationships between $|d_{31}|$ and $d_{33}$ of the piezoelectric members of the piezoelectric devices that were produced in the embodiments according to the mode of the present invention and in the comparative example. Also, in FIG. 16 are shown an area indicating the relationship between $|d_{31}|$ and $d_{33}$ of the piezoelectric member for the piezoelectric device of this mode, and a conventional area indicating the relationship between $|d_{31}|$ and $d_{33}$.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-241429, filed Aug. 23, 2005, which is hereby incorporated by reference herein in its entirety.

What is claimed is:

1. A piezoelectric device comprising:
   a piezoelectric member; and
   a pair of electrodes contacting the piezoelectric member,
   wherein, for piezoelectric constants $d_{33}$ and $d_{31}$ of the piezoelectric member, the following relational expression (I) is established:

$0.1 \leq |d_{33}/d_{31}| \leq 1.8$     (I), and
   wherein the piezoelectric constants $d_{33}$ and $d_{31}$ are values measured by applying an electric field of at least 150 kV/cm to said piezoelectric member.

2. A piezoelectric device according to claim 1, wherein a thickness of the piezoelectric element is equal to or greater than 1 μm and equal to or smaller than 10 μm.

3. A piezoelectric device according to claim 1, wherein the piezoelectric member is formed of a PZT piezoelectric material or a relaxor piezoelectric material.

4. A piezoelectric device according to claim 1, wherein the piezoelectric member is a <100> uniaxial crystal or a single crystal.

5. A piezoelectric device according to claim 4,
   wherein a vibration plate is provided for one of the electrodes, and an oxide layer is formed on a surface of the vibration plate; and
   wherein the electrode for which the vibration plate is provided includes, at the least, a conductive oxide layer.

6. A piezoelectric device according to claim 5, wherein the electrode for which the vibration plate is provided includes two or more conductive oxide layers.

7. A liquid discharge head comprising:
   a separate liquid chamber communicating with a discharge port; and
   a piezoelectric device which is arranged so as to correspond to the separate liquid chamber and include a piezoelectric member having a pair of electrodes, so that liquid in the separate chamber is discharged from the discharge port,
   wherein, for piezoelectric constants $d_{33}$ and $d_{31}$ of the piezoelectric member, the following relational expression (I) is established:

$0.1 \leq |d_{33}/d_{31}| \leq 1.8$     (I), and
   wherein the piezoelectric constants $d_{33}$ and $d_{31}$ are values measured by applying an electric field of at least 150 kV/cm to said piezoelectric member.

8. A liquid discharge apparatus comprising:
   a liquid discharge head for discharging a liquid; and
   a piezoelectric device, for generating energy for discharging a liquid, including a piezoelectric member and a pair of electrodes,
   wherein for piezoelectric constants $d_{33}$ and $d_{31}$ of the piezoelectric member, the following relational expression (I) is established:

$0.1 \leq |d_{33}/d_{31}| \leq 1.8$     (I), and
   wherein the piezoelectric constants $d_{33}$ and $d_{31}$ are values measured by applying an electric field of at least 150 kV/cm to said piezoelectric member.

* * * * *

UNITED STATES PATENT AND TRADEMARK OFFICE
CERTIFICATE OF CORRECTION

PATENT NO. : 7,309,950 B1
APPLICATION NO. : 11/564643
DATED : December 18, 2007
INVENTOR(S) : Aoki et al.

It is certified that error appears in the above-identified patent and that said Letters Patent is hereby corrected as shown below:

COLUMN 8:
Line 39, "include" should be deleted.

COLUMN 9:
Line 9, "dorpant" should read --dopant--.

COLUMN 10:
Line 15, "that," should read --that--.
Line 53, "well known" should read --well-known--.
Line 54, "material, used" should read --material used--.
Line 60, "diketone" should read --β-diketone--.

COLUMN 13:
Line 28, "(FIGS. 10-1)." should read --(FIG. 10-1).--.
Line 39, "(FIGS. 10-2)." should read --(FIG. 10-2).--.
Line 44, "(FIGS." should read --(FIG.--.
Line 65, "[$m^3$/min]," should read --[$cm^3$/min],--.

COLUMN 14:
Line 55, "(FIGS. 10-4)." should read --(FIG. 10-4).--.
Line 58, "(FIGS. 10-5)." should read --(FIG. 10-5).--.
Line 63, "(FIGS. 10-6)." should read --(FIG. 10-6).--.
Line 67, "(FIGS. 10-7)." should read --(FIG. 10-7).--.

COLUMN 15:
Line 10, "than 5%." should read --than 5%,--.
Line 32, "FIGS. 13-1" should read --FIG. 13-1--.
Line 34, "FIGS. 13-2" should read --FIG. 13-2--.

COLUMN 16:
Line 39, "FIGS. 15-1" should read --FIG. 15-1--.
Line 41, "FIGS. 15-2" should read --FIG. 15-2--.

UNITED STATES PATENT AND TRADEMARK OFFICE
CERTIFICATE OF CORRECTION

PATENT NO. : 7,309,950 B1
APPLICATION NO. : 11/564643
DATED : December 18, 2007
INVENTOR(S) : Aoki et al.

It is certified that error appears in the above-identified patent and that said Letters Patent is hereby corrected as shown below:

COLUMN 17:
Lines 19-20:

"$K=(S_{11}^S)^2(h^P)^4+4S_{11}^S S_{11}^P h^s(h^P)^3+6S_{11}^S S_{11}^P(h^S)^2$
$(h^P)^2+4S_{11}^S S_{11}^P(h^S)^3 hP+(S_{11}^P)^2(h^S)^4$    Expression 1-2"

should read

--$K=(S_{11}^S)^2(h^P)^4+4S_{11}^S S_{11}^P h^S(h^P)^3+6S_{11}^S S_{11}^P(h^S)^2$
$(h^P)^2+4S_{11}^S S_{11}^P(h^S)^3 h^P+(S_{11}^P)^2(h^S)^4$    Expression 1-2--.

COLUMN 18:
Line 35, "$S_{11}^S=$" should read --$S_{11}^P=$--.

COLUMN 19:
Table 1, "Third Embodiment PNN-PT" should read --Third Embodiment PMN-PT--.

Signed and Sealed this

Third Day of March, 2009

JOHN DOLL
*Acting Director of the United States Patent and Trademark Office*